United States Patent
Lin et al.

(10) Patent No.: US 9,368,563 B2
(45) Date of Patent: *Jun. 14, 2016

(54) SEMICONDUCTOR DEVICE INCLUDING INTEGRATED PASSIVE DEVICE FORMED OVER SEMICONDUCTOR DIE WITH CONDUCTIVE BRIDGE AND FAN-OUT REDISTRIBUTION LAYER

(71) Applicant: STATS ChipPAC, Ltd., Singapore (SG)

(72) Inventors: Yaojian Lin, Singapore (SG); Kai Liu, Phoenix, AZ (US); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/092,304

(22) Filed: Nov. 27, 2013

(65) Prior Publication Data

US 2014/0084415 A1   Mar. 27, 2014

Related U.S. Application Data

(63) Continuation of application No. 13/311,266, filed on Dec. 5, 2011, now Pat. No. 8,624,353.

(60) Provisional application No. 61/426,186, filed on Dec. 22, 2010.

(51) Int. Cl.
*H01L 27/00* (2006.01)
*H01L 49/02* (2006.01)
(Continued)

(52) U.S. Cl.
CPC .............. *H01L 28/10* (2013.01); *H01L 21/561* (2013.01); *H01L 23/3121* (2013.01);
(Continued)

(58) Field of Classification Search
CPC .......... H01L 2924/30107; H01L 2924/19042; H01L 2924/1206; H03H 2001/0078
See application file for complete search history.

(56) References Cited

U.S. PATENT DOCUMENTS 5,416,356 A * 5/1995 Staudinger et al. ........... 257/531
5,656,849 A    8/1997 Burghartz et al.
(Continued)

FOREIGN PATENT DOCUMENTS

CN    101609833 A    12/2009
CN    101834178 A     9/2010
(Continued)

*Primary Examiner* — Ngan Ngo
(74) *Attorney, Agent, or Firm* — Robert D. Atkins; Patent Law Group: Atkins and Associates, P.C.

(57) ABSTRACT

A semiconductor device has a first semiconductor die. A first inductor is formed over the first semiconductor die. A second inductor is formed over the first inductor and aligned with the first inductor. An insulating layer is formed over the first semiconductor die and the first and second inductors. A conductive bridge is formed over the insulating layer and electrically connected between the second inductor and the first semiconductor die. In one embodiment, the semiconductor device has a second semiconductor die and a conductive layer is formed between the first and second semiconductor die. In another embodiment, a capacitor is formed over the first semiconductor die. In another embodiment, the insulating layer has a first thickness over a footprint of the first semiconductor die and a second thickness less than the first thickness outside the footprint of the first semiconductor die.

24 Claims, 26 Drawing Sheets

(51) Int. Cl.
*H01L 21/56* (2006.01)
*H01L 23/522* (2006.01)
*H01L 23/538* (2006.01)
*H01L 25/16* (2006.01)
*H01L 23/00* (2006.01)
*H01L 23/31* (2006.01)
*H03H 1/00* (2006.01)
*H01L 23/498* (2006.01)

(52) U.S. Cl.
CPC ....... *H01L 23/3128* (2013.01); *H01L 23/5223* (2013.01); *H01L 23/5227* (2013.01); *H01L 23/5389* (2013.01); *H01L 24/19* (2013.01); *H01L 24/20* (2013.01); *H01L 24/96* (2013.01); *H01L 24/97* (2013.01); *H01L 25/16* (2013.01); *H01L 21/568* (2013.01); *H01L 23/49816* (2013.01); *H01L 2224/12105* (2013.01); *H01L 2224/24137* (2013.01); *H01L 2224/24195* (2013.01); *H01L 2224/48091* (2013.01); *H01L 2224/73265* (2013.01); *H01L 2924/014* (2013.01); *H01L 2924/01006* (2013.01); *H01L 2924/01029* (2013.01); *H01L 2924/01073* (2013.01); *H01L 2924/01074* (2013.01); *H01L 2924/01322* (2013.01); *H01L 2924/1206* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/19042* (2013.01); *H01L 2924/30107* (2013.01); *H03H 2001/0078* (2013.01)

(56) References Cited

U.S. PATENT DOCUMENTS

| | | | |
|---|---|---|---|
| 5,915,188 A * | 6/1999 | Ramakrishnan et al. | 438/381 |
| 6,313,516 B1 * | 11/2001 | Tsui et al. | 257/538 |
| 6,518,642 B2 * | 2/2003 | Kim et al. | 257/528 |
| 7,199,016 B2 * | 4/2007 | Heston et al. | 438/382 |
| 7,535,079 B2 * | 5/2009 | Remmel et al. | 257/532 |
| 7,811,919 B2 | 10/2010 | Daley et al. | |
| 7,816,792 B2 | 10/2010 | Tews et al. | |
| 7,898,059 B2 * | 3/2011 | Remmel et al. | 257/532 |
| 7,986,023 B2 | 7/2011 | Tews et al. | |
| 8,159,046 B2 * | 4/2012 | Cho et al. | 257/532 |
| 8,169,050 B2 | 5/2012 | Daley et al. | |
| 8,232,622 B2 | 7/2012 | Urakawa | |
| 8,471,357 B2 | 6/2013 | Huang et al. | |
| 8,624,353 B2 * | 1/2014 | Lin et al. | 257/531 |
| 2003/0227095 A1 | 12/2003 | Fujisawa et al. | |
| 2004/0080021 A1 * | 4/2004 | Casper | H01L 21/4846 257/528 |
| 2005/0253257 A1 * | 11/2005 | Chiu | H01L 23/49833 257/724 |
| 2006/0163694 A1 | 7/2006 | Ohguro | |
| 2006/0273395 A1 * | 12/2006 | Tanaka | 257/350 |
| 2008/0012091 A1 | 1/2008 | Ding et al. | |
| 2008/0042236 A1 | 2/2008 | Seah Teo Leng | |
| 2008/0290457 A1 | 11/2008 | Ker et al. | |
| 2008/0308917 A1 | 12/2008 | Pressel et al. | |
| 2009/0001509 A1 * | 1/2009 | Lin | H01L 21/77 257/531 |
| 2009/0155959 A1 * | 6/2009 | Lin | H01L 21/4857 438/124 |
| 2009/0170242 A1 * | 7/2009 | Lin | H01L 21/6835 438/107 |
| 2009/0224365 A1 * | 9/2009 | Remmel et al. | 257/533 |
| 2009/0230542 A1 * | 9/2009 | Lin | H01L 27/016 257/700 |
| 2009/0243034 A1 * | 10/2009 | Stribley | H01L 23/5227 257/531 |
| 2009/0309688 A1 | 12/2009 | Kawano | |
| 2009/0322447 A1 | 12/2009 | Daley et al. | |
| 2010/0006978 A1 | 1/2010 | Nakashiba | |
| 2010/0052096 A1 | 3/2010 | Urakawa | |
| 2011/0042783 A1 * | 2/2011 | Ni | 257/531 |
| 2011/0062549 A1 | 3/2011 | Lin | |
| 2011/0169130 A1 | 7/2011 | Uchida | |
| 2011/0204509 A1 | 8/2011 | Lin et al. | |
| 2011/0241215 A1 * | 10/2011 | Sankman | H01L 21/6835 257/773 |
| 2011/0316118 A1 | 12/2011 | Uchida et al. | |
| 2012/0062040 A1 | 3/2012 | Kaeriyama | |
| 2012/0187532 A1 | 7/2012 | Uchida | |
| 2012/0267756 A1 | 10/2012 | Shi et al. | |
| 2013/0147011 A1 | 6/2013 | Okushima et al. | |

FOREIGN PATENT DOCUMENTS

| | | |
|---|---|---|
| TW | I234253 B | 6/2005 |
| WO | 2010140297 A1 | 12/2010 |

* cited by examiner

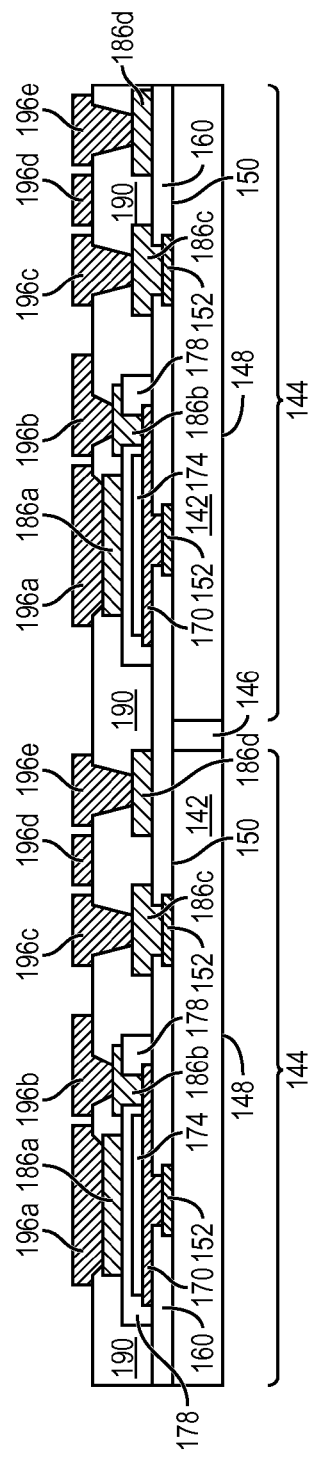
FIG. 4h
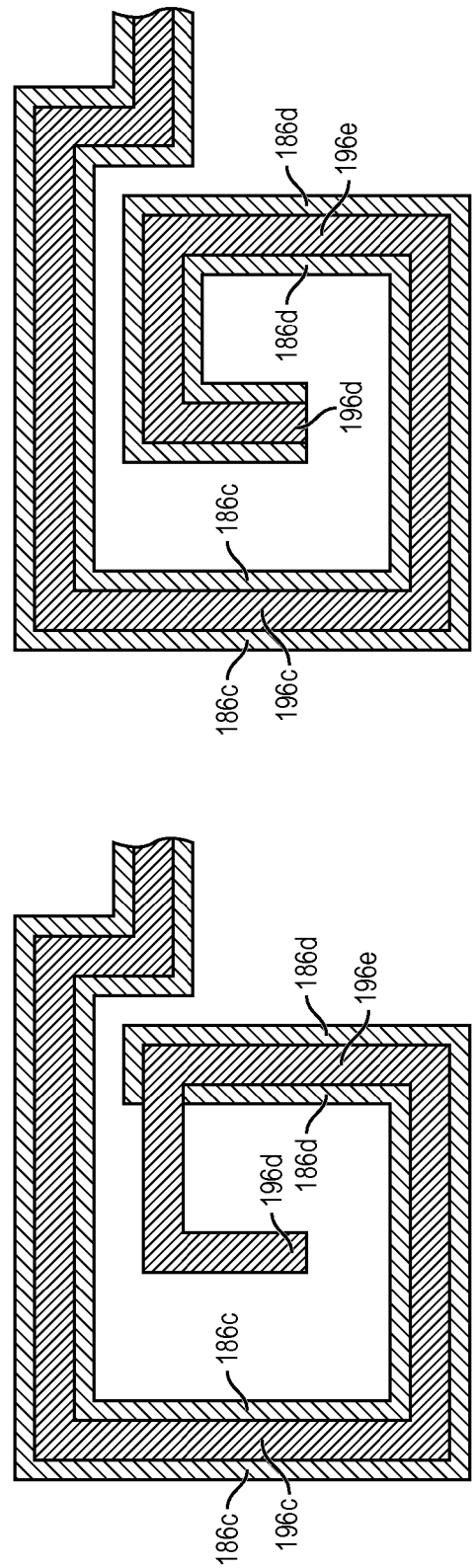
FIG. 4j
FIG. 4i

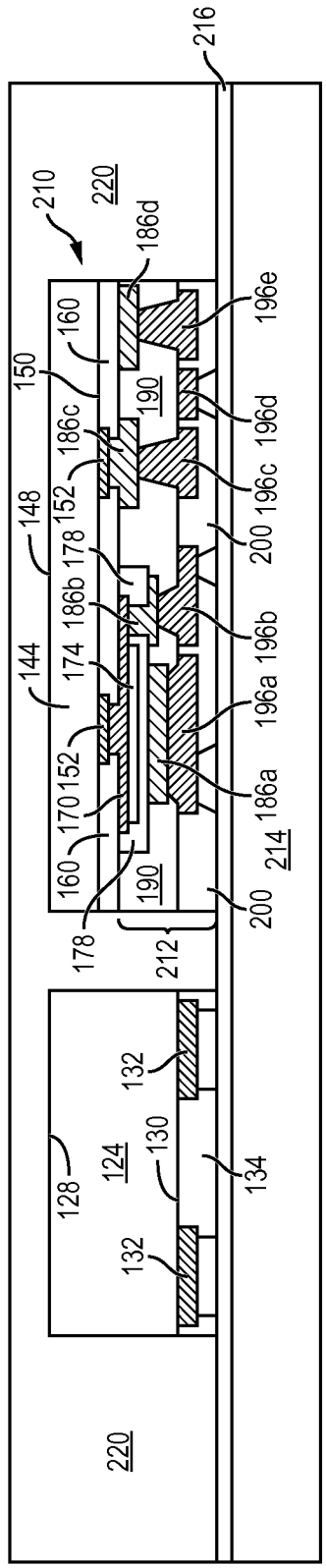
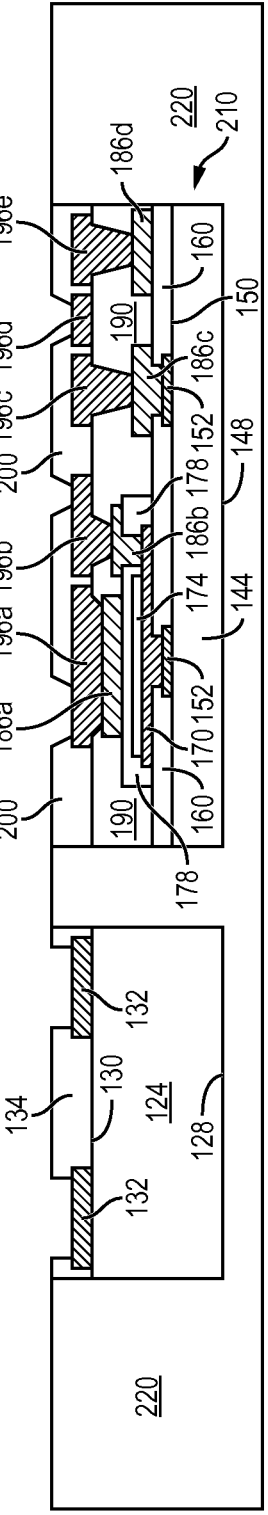
FIG. 5c
FIG. 5d

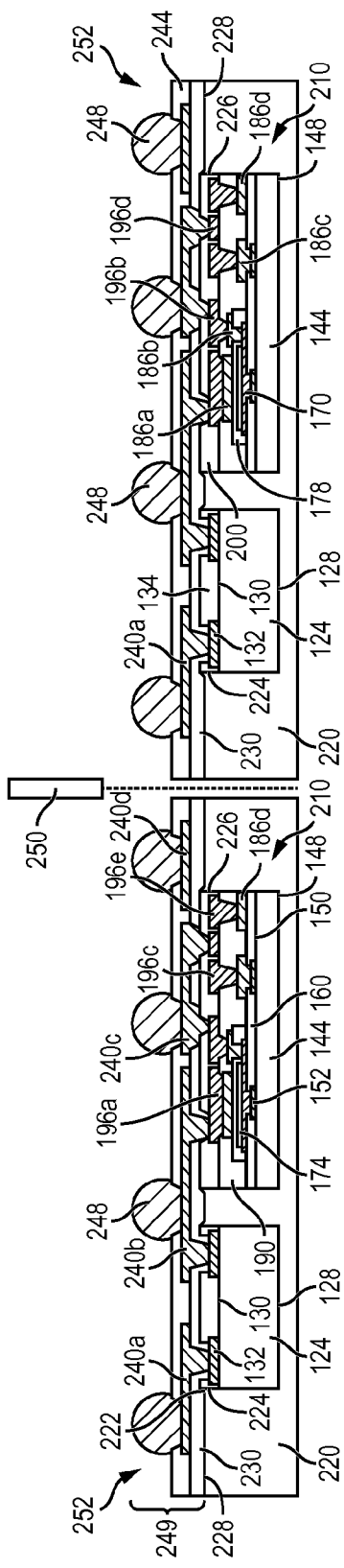
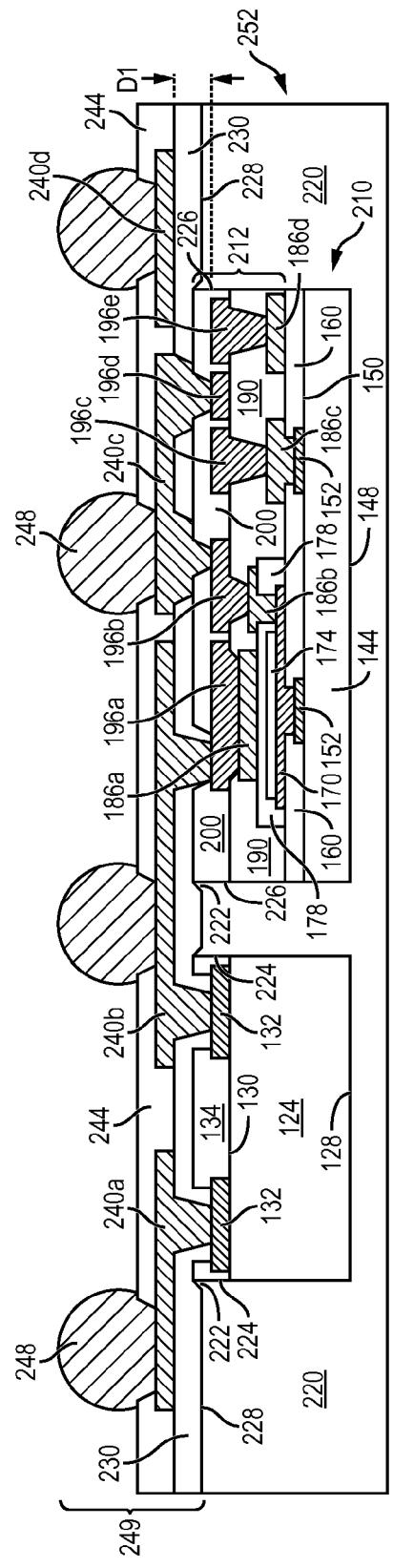
FIG. 5i
FIG. 6

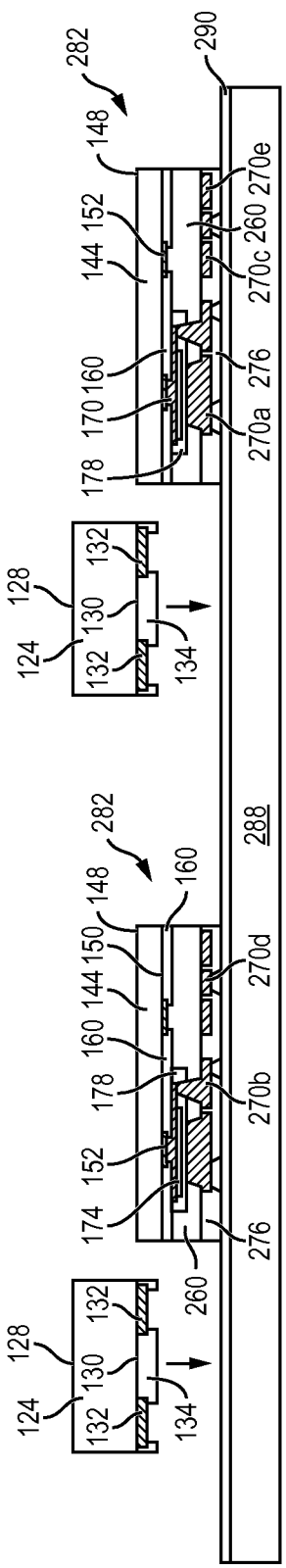
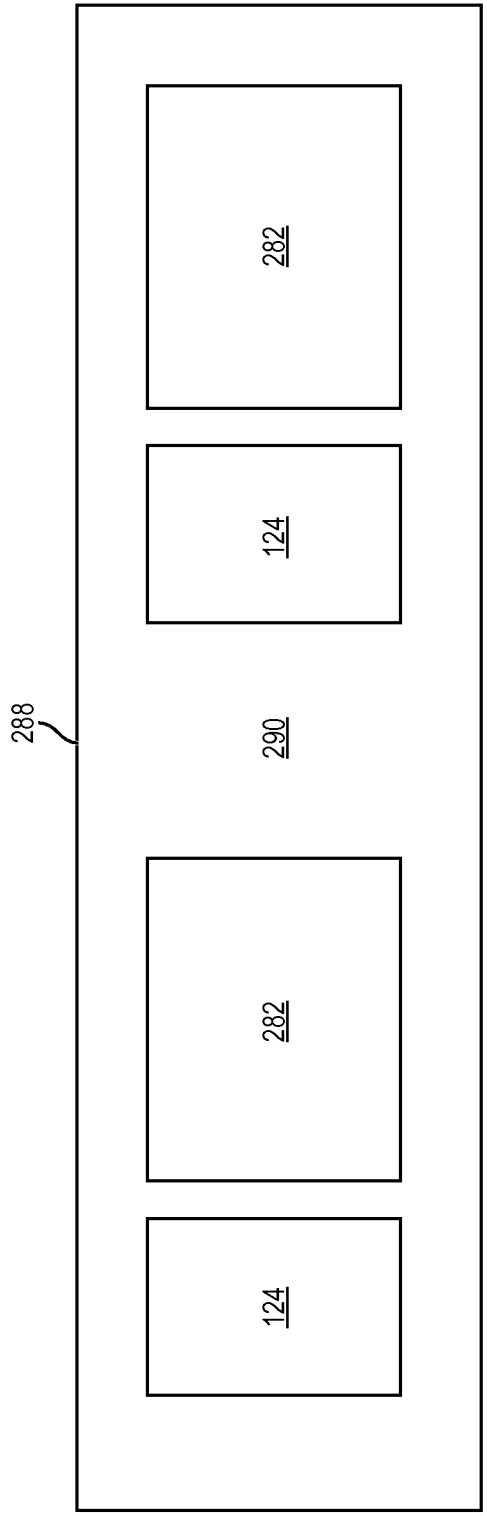
FIG. 9a
FIG. 9b

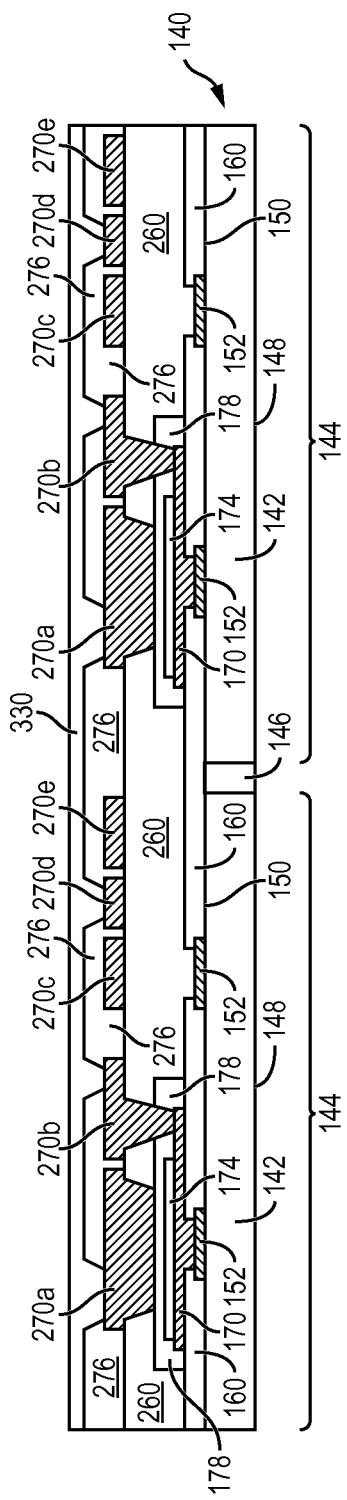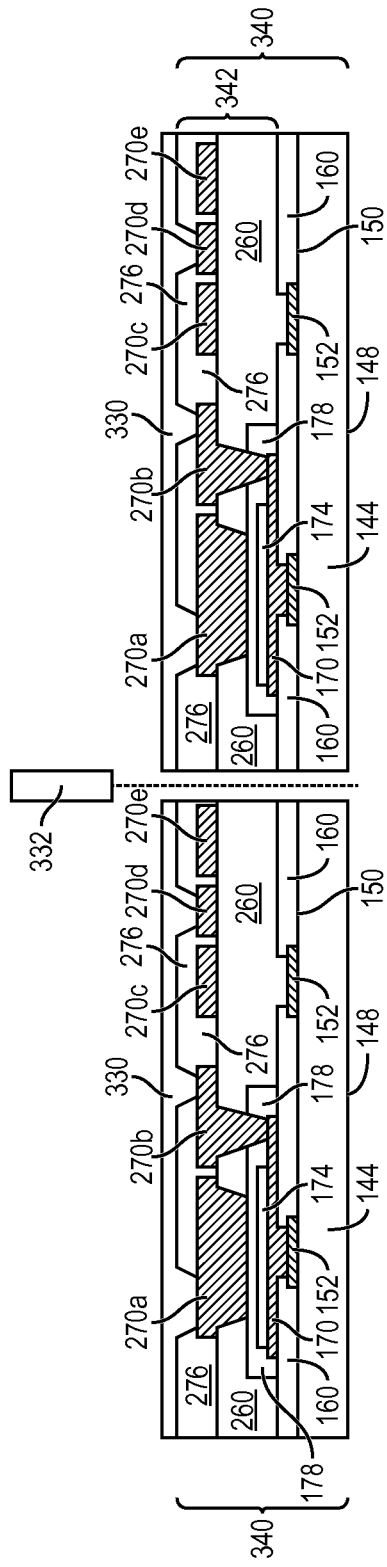
FIG. 11a
FIG. 11b

SEMICONDUCTOR DEVICE INCLUDING INTEGRATED PASSIVE DEVICE FORMED OVER SEMICONDUCTOR DIE WITH CONDUCTIVE BRIDGE AND FAN-OUT REDISTRIBUTION LAYER

CLAIM TO DOMESTIC PRIORITY

The present application is a continuation of U.S. patent application Ser. No. 13/311,266, now U.S. Pat. No. 8,624,353, filed Dec. 5, 2011, which claims the benefit of U.S. Provisional Application No. 61/426,186, filed Dec. 22, 2010, which applications are incorporated herein by reference.

FIELD OF THE INVENTION

The present invention relates in general to semiconductor devices and, more particularly, to a semiconductor device and method of forming an integrated passive device over and electrically connected to a semiconductor die with a conductive bridge and fan-out redistribution layer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

In a conventional fan-out wafer level chip scale package (Fo-WLCSP), IPDs are commonly formed externally to semiconductor die within the Fo-WLCSP. The process of forming IPDs externally to semiconductor die, however, carries a significant manufacturing cost, particularly for high current applications. Additionally, the process of forming IPDs externally to semiconductor die is prone to cause some degree of misalignment, which can degrade the quality and reliability of the IPDs, particularly when the IPDs are formed over semiconductor die and also separately during subsequent formation of redistribution layers (RDLs). Furthermore, leakage current between IPDs and electrically conductive RDLs can occur, particularly in high current applications, which reduces the reliability and functionality of the semiconductor package.

SUMMARY OF THE INVENTION

A need exists to produce a reliable and cost-effective semiconductor package with aligned IPDs formed externally to a semiconductor die and low leakage current. Accordingly, in one embodiment, the present invention is a method of making a semiconductor device comprising the steps of providing a semiconductor die, forming a first inductor over the semiconductor die, and forming a second inductor over the first inductor.

In another embodiment, the present invention is a method of making a semiconductor device comprising the steps of providing a substrate, disposing a first conductive layer over the substrate to form a passive device, and forming a second conductive layer over the first conductive layer.

In another embodiment, the present invention is a semiconductor device comprising a substrate. A first conductive layer is disposed over the substrate to form a first passive device and a portion of a second passive device.

In another embodiment, the present invention is a semiconductor device comprising a first semiconductor die. An inductor is formed on a surface of the first semiconductor die.

BRIEF DESCRIPTION OF THE DRAWINGS

FIGS. 4a-4l illustrate a process of forming IPDs over a semiconductor die;

FIGS. 5a-5i illustrate a process of forming a conductive bridge and a fan out redistribution layer over semiconductor die and IPDs;

FIG. 6 illustrates a semiconductor package with a conductive bridge and a fan out redistribution layer formed over semiconductor die and top and bottom inductor wings;

FIGS. 9a-9i illustrate a process of forming a conductive bridge and a fan out RDL over semiconductor die with a single inductor;

FIGS. 11a-11b illustrate a process of forming a temporary planarization layer over an IPD and a semiconductor die;

DETAILED DESCRIPTION OF THE DRAWINGS

Figure 1:
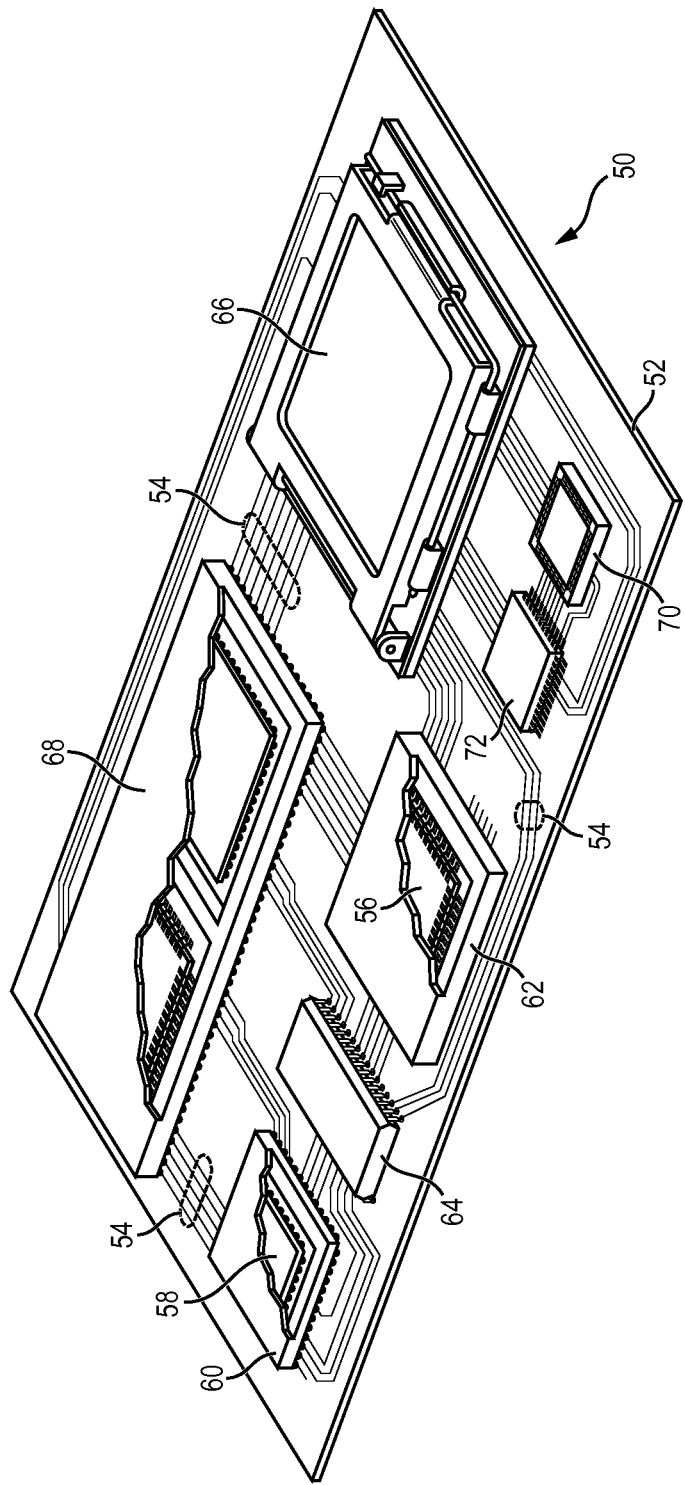
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
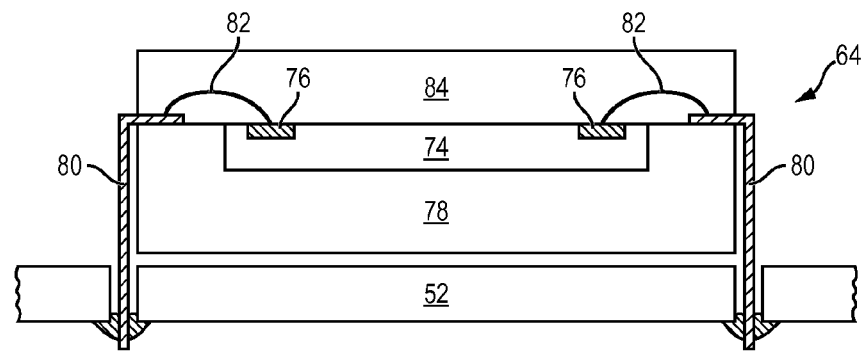
FIGS. 2a-2c illustrate further detail of the representative semiconductor packages mounted to the PCB.
Figure 2B:
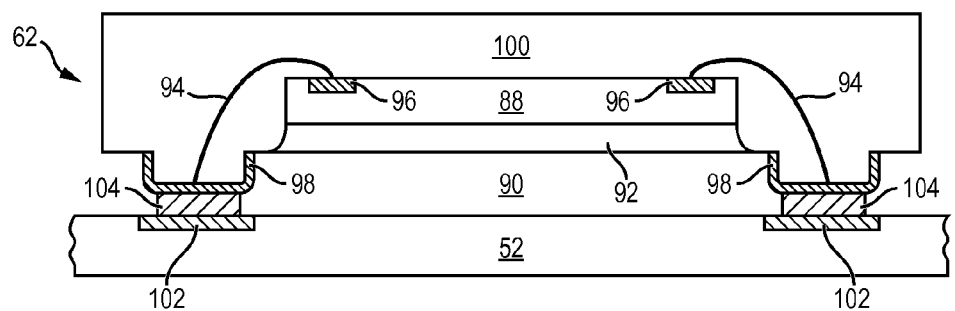
Figure 2C:
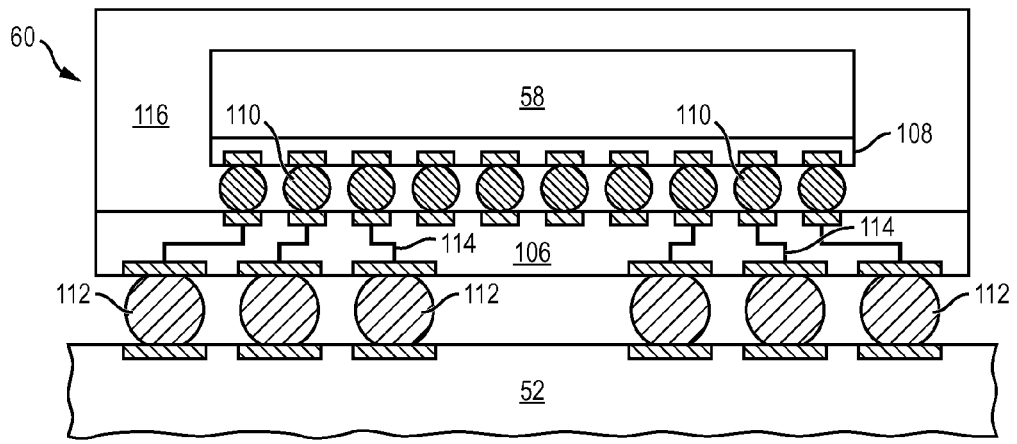

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
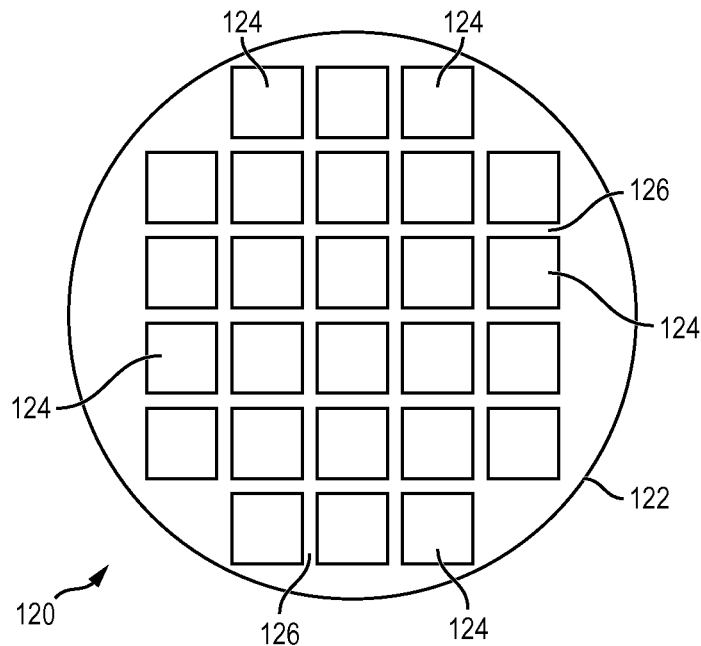
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
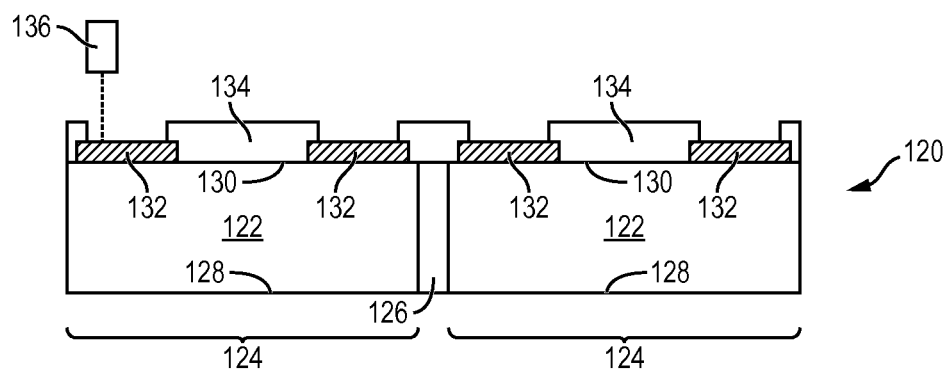

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be disposed side-by-side a first distance from the edge of semiconductor die 124, as shown in FIG. 3b. Alternatively, conductive layer 132 can be offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, screen printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), organic polymer, or other material having similar insulating and structural properties. A portion of insulating layer 134 is removed by an etching process with a patterned photoresist layer, to expose conductive layer 132. Alternatively, a portion of insulating layer 134 is removed by laser direct ablation (LDA) using laser 136 to expose conductive layer 132.

Figure 3C:
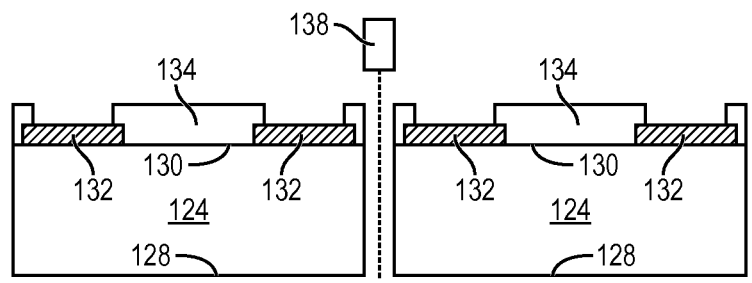

In FIG. 3c, semiconductor wafer 120 is singulated through saw street 126 and insulating layer 134 using a saw blade or laser cutting tool 138 into individual semiconductor die 124.

Figure 4A:
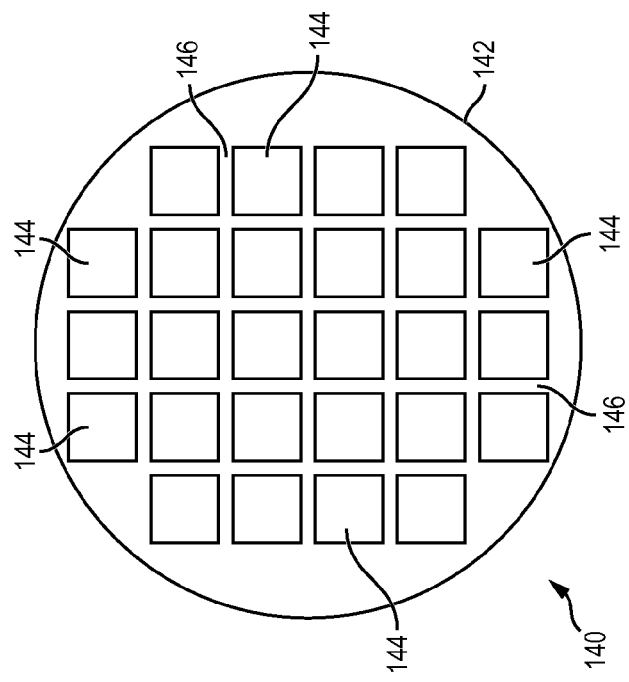

FIG. 4a shows a semiconductor wafer 140 with a base substrate material 142, such as silicon, germanium, gallium arsenide, indium phosphide, or silicon carbide, for structural support. A plurality of semiconductor die or components 144 is formed on wafer 140 separated by a non-active, inter-die wafer area or saw street 146 as described above. Saw street 146 provides cutting areas to singulate semiconductor wafer 140 into individual semiconductor die 144.

Figure 4B:
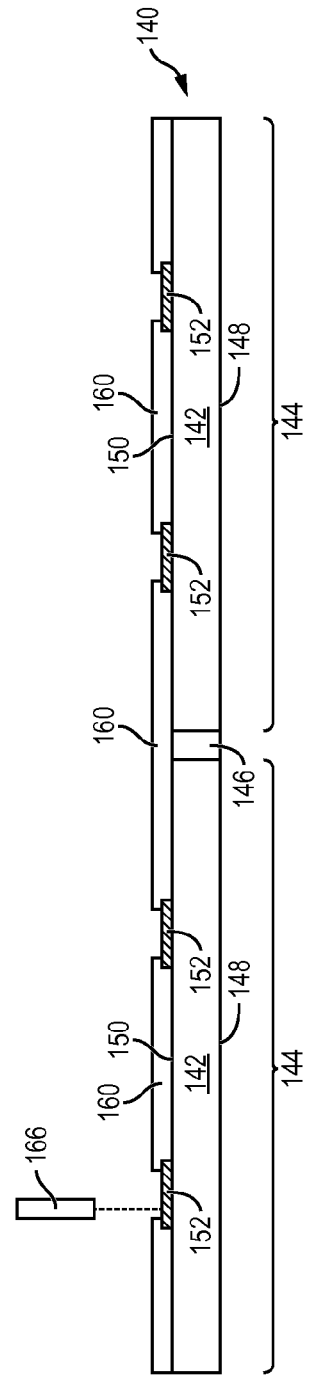

FIG. 4b shows a cross-sectional view of a portion of semiconductor wafer 140. Each semiconductor die 144 has a back surface 148 and active surface 150 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 150 to implement analog circuits or digital circuits, such as DSP, ASIC, memory, or other signal processing circuit. Semiconductor die 144 may also contain IPDs, such as inductors, capacitors, and resistors, for RF signal processing.

An electrically conductive layer 152 is formed over active surface 150 using PVD, CVD, electrolytic plating, electroless plating process, or other suitable metal deposition process. Conductive layer 152 can be one or more layers of Al, Cu, Sn, Ni, Au, Ag, or other suitable electrically conductive material. Conductive layer 152 operates as contact pads electrically connected to the circuits on active surface 150. Conductive layer 152 can be disposed side-by-side a first distance from the edge of semiconductor die 144, as shown in FIG. 4b. Alternatively, conductive layer 152 can be offset in multiple rows such that a first row of contact pads is disposed a first distance from the edge of the die, and a second row of contact pads alternating with the first row is disposed a second distance from the edge of the die.

An insulating or passivation layer 160 is formed over active surface 150 and conductive layer 152 using PVD, CVD, screen printing, spin coating, spray coating, sintering or thermal oxidation. The insulating layer 160 contains one or more layers of SiO2, Si3N4, SiON, Ta2O5, Al2O3, organic polymer, or other material having similar insulating and structural properties. A portion of insulating layer 160 is removed by an etching process with a patterned photoresist layer to expose conductive layer 152. Alternatively, a portion of insulating layer 160 is removed by LDA using laser 166 to expose conductive layer 152.

Figure 4C:
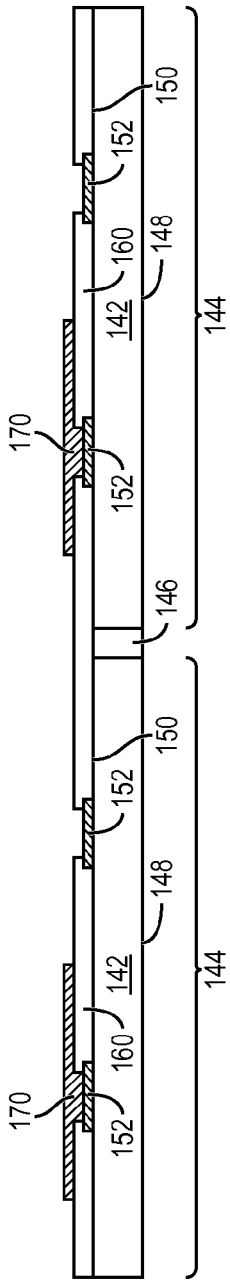

In FIG. 4c, an electrically conductive layer 170 is formed over insulating layer 160 and conductive layer 152 using patterning with PVD, CVD, sputtering, electrolytic plating, electroless plating process, or other suitable metal deposition process. Conductive layer 170 can be one or more layers of Al, Cu, Sn, Ni, Au, Ag, or other suitable electrically conductive material. Conductive layer 170 is electrically connected to conductive layer 152.

Figure 4D:
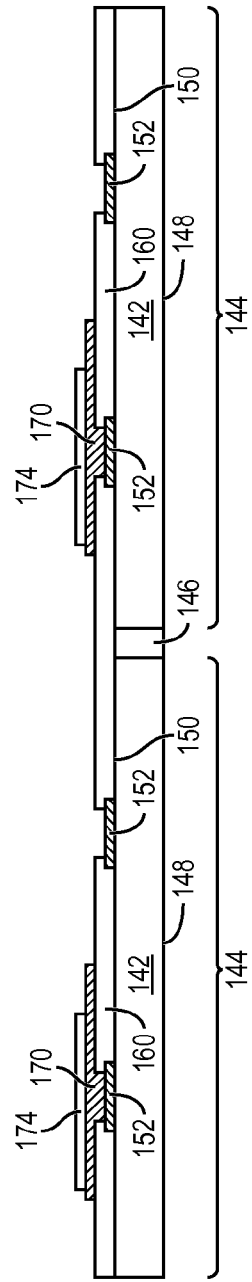

In FIG. 4d, a resistive layer 174 is formed over conductive layer 170 using PVD, CVD, or other suitable deposition process. In one embodiment, resistive layer 174 can be tantalum silicide (TaxSiy) or other metal silicides, TaN, nickel chromium (NiCr), titanium (Ti), titanium nitride (TiN), titanium tungsten (TiW), or doped poly-silicon having a resistivity between 1-200 Ohm/square.

Figure 4E:
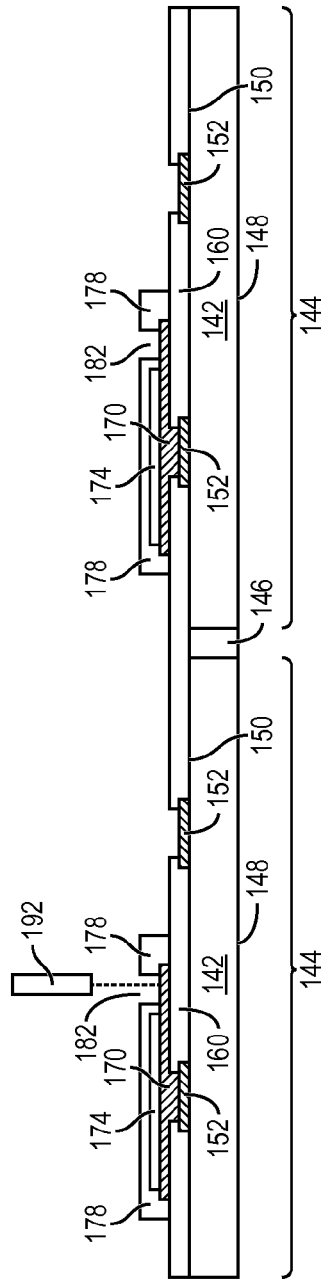

In FIG. 4e, an insulating or dielectric layer 178 is formed over resistive layer 174, conductive layer 170, and insulating layer 160. Insulating layer 178 contains one or more layers of SiO2, Si3N4, SiON, Ta2O5, Al2O3, polyimide (PI), benzocyclobutene (BCB), polybenzoxazoles (PBO), or other material having similar insulating and structural properties. In one embodiment, insulating layer 178 acts as a capacitor dielectric material. A portion of insulating layer 178 is removed by an etching process with a patterned photoresist layer, to create opening 182 and expose a portion of conductive layer 170. Alternatively, a portion of insulating layer 178 is removed by LDA using laser 192 to expose a portion of conductive layer 170 and to create opening 182.

Figure 4F:
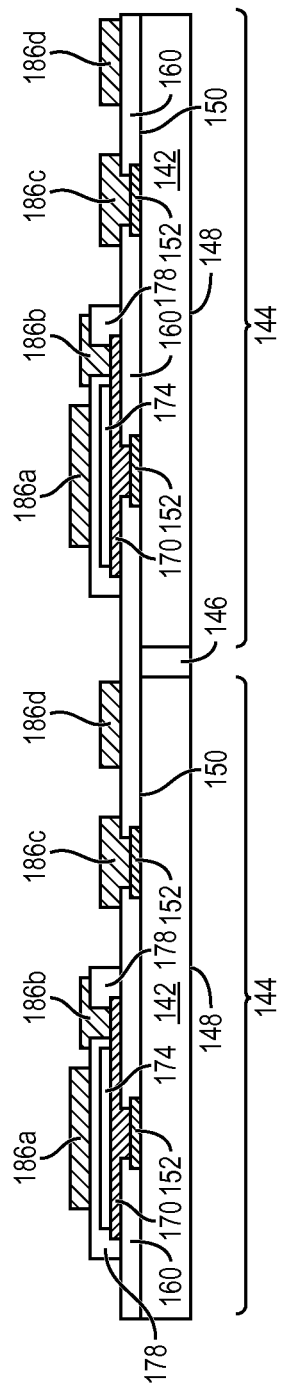

In FIG. 4f, an electrically conductive layer 186 is formed over insulating layer 178, conductive layer 170, insulating layer 160, and conductive layer 152 using patterning with PVD, CVD, sputtering, electrolytic plating, electroless plating process, or other suitable metal deposition process to form individual portions or sections 186a-186d. Conductive layer 186 includes one or more layers of Al, Cu, Sn, Ni, Au, Ag, or other suitable electrically conductive material. In one embodiment, conductive layer 186 is deposited using a suitable selective copper plating process, such as ion milling or back sputtering, with a suitable seed alloy such as titanium copper (TiCu), titanium tungsten copper (TiWCu), or tantalum nitrogen copper (TaNCu). In another embodiment, conductive layer 186 has a thickness between 3 and 15 micrometers (μm).

The individual portions of conductive layer 186a-186d can be electrically common or electrically isolated according to the design and function of the individual semiconductor die 144. In one embodiment, conductive layer 170, resistive layer 174, insulating layer 178, and conductive layer 186a form a metal insulator metal (MIM) capacitor. A portion of conductive layer 186b extends vertically through opening 182 to electrically connect conductive layer 186b to conductive layer 170. Conductive layer 186c is electrically connected to conductive layer 152. The individual sections of conductive layer 186c and 186d can be wound or coiled in plan-view to produce or exhibit the desired characteristics of an inductor. Conductive layers 186c-186d form a bottom inductor wing formed over and within a footprint of semiconductor die 144.

Figure 4G:
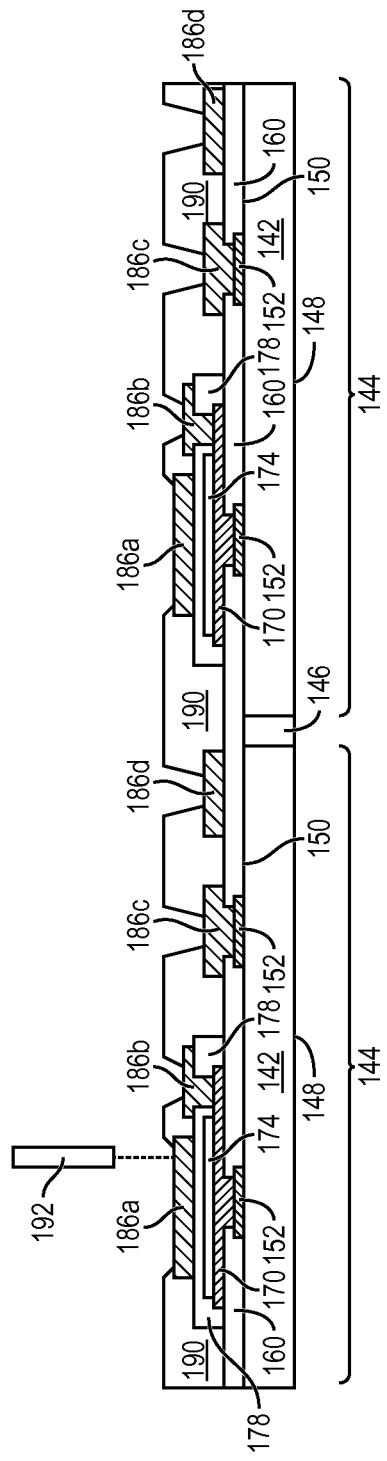

In FIG. 4g, an insulating or passivation layer 190 is formed over conductive layer 186, insulating layer 178, and insulating layer 160 using PVD, CVD, printing, spin coating, spray coating, screen printing or lamination. Insulating layer 190 contains one or more layers of SiO2, Si3N4, SiON, Ta2O5, Al2O3, organic polymer, or other material having similar insulating and structural properties. In one embodiment, insulating layer 190 undergoes a curing process after being deposited, with a curing temperature ranging between 165-380 degrees Celsius (° C.). In another embodiment, a thickness of insulating layer 190 ranges between 5-20 μm. A portion of insulating layer 190 is removed by an etching process with a patterned photoresist layer to expose conductive layer 186. Alternatively, a portion of insulating layer 190 is removed by LDA using laser 192 to expose conductive layer 186.

In FIG. 4h, an electrically conductive layer 196 is formed over insulating layer 190 and conductive layer 186 using patterning with PVD, CVD, sputtering, electrolytic plating, electroless plating process, or other suitable metal deposition process to form individual portions or sections 196a-196e. Conductive layer 196 includes one or more layers of Al, Cu, Sn, Ni, Au, Ag, or other suitable electrically conductive material. In one embodiment, conductive layer 196 is deposited using a suitable selective copper plating process, such as ion milling or back sputtering, with a suitable seed alloy such as TiCu, TiWCu, or TaNC. In another embodiment, conductive layer 196 has a thickness between 3 and 15 μm.

The individual portions of conductive layer 196a-196e can be electrically common or electrically isolated according to the design and function of the individual semiconductor die 144. Conductive layer 196a is electrically connected to and aligned with conductive layer 186a. Conductive layer 196b is electrically connected to and aligned with conductive layer 186b. Conductive layer 196c is electrically connected to and aligned with conductive layer 186c. Conductive layer 196e is electrically connected to and aligned with conductive layer 186d. The individual sections of conductive layer 196c-196e can be wound or coiled in plan-view to produce or exhibit the desired characteristics of an inductor. Conductive layers 196c-196e form a top inductor wing formed over and within a footprint of semiconductor die 144.

FIG. 4i shows a plan view of the footprint of the top and bottom inductor wings shown in FIG. 4h. In one embodiment, shown in FIG. 4i, conductive layers 196c-196e have a smaller cross sectional width than conductive layers 186c-186d. The cross sectional widths of conductive layers 196c-196e and conductive layers 186c-186d can vary, according to the design and functionality of semiconductor die 144. In another embodiment, conductive layers 196c-196e have a cross sectional width that is greater than or equal to the cross sectional width of conductive layers 186c-186d.

The top inductor wing 196c-196e, is longer than the bottom inductor wing 186c-186d, such that conductive layer 196d extends beyond a footprint of the bottom inductor wing 186c-186d. In another embodiment, shown in FIG. 4j, the top inductor wing 196c-196e, is substantially the same length as the bottom inductor wing 186c-186d, such that the entire footprint of the top inductor wing 196c-196e is disposed within the footprint of the bottom inductor wing 186c-186d. The lengths of the top inductor wing 196c-196e and the bottom inductor wing 186c-186d can vary according to the design and functionality of semiconductor die 144.

In FIGS. 4h-4j, conductive layer 196c is aligned with conductive layer 186c, and conductive layer 196e is aligned with conductive layer 186d. The top inductor wing 196c-196e is stacked over and aligned along the entire path or coil of the bottom inductor wing 186c-186d, and a footprint of the top inductor wing 196c-196e is within a footprint of the bottom inductor wing 186c-186d for the entire length of the coil of the bottom inductor wing 186c-186d. In another embodiment, the top inductor wing 196c-196e and the bottom inductor wing 186c-186d are aligned with a horizontal offset such that the footprint of the top inductor wing 196c-196e is outside the footprint of the bottom inductor wing 186c-186d. The process of forming IPDs externally to semiconductor die is prone to cause some degree of misalignment which can degrade the IPDs, particularly when the IPDs are formed over semiconductor die and also separately during subsequent formation of RDLs. The top inductor wing 196c-196e is stacked over and aligned along the entire path or coil of the bottom inductor wing 186c-186d within semiconductor die 210 for higher quality and reliable IPDs.

Figure 4K:
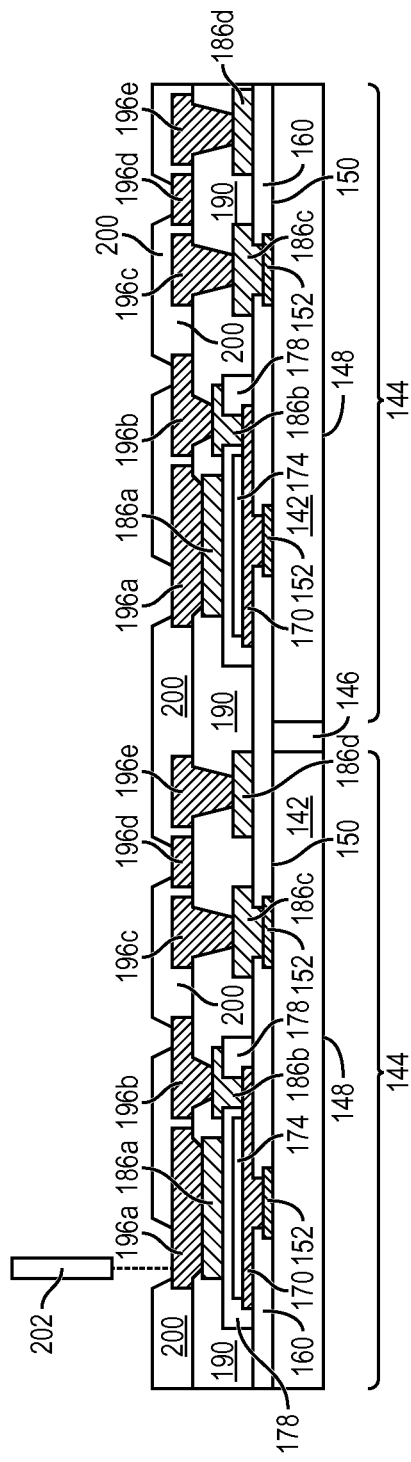

In FIG. 4k, an insulating or passivation layer 200 is formed over insulating layer 190 and conductive layer 196 using PVD, CVD, printing, spin coating, spray coating, screen printing or lamination. Insulating layer 200 contains one or more layers of SiO2, Si3N4, SiON, Ta2O5, Al2O3, organic polymer, or other material having similar insulating and structural properties. In one embodiment, insulating layer 200 undergoes a curing process after deposition, with a curing temperature ranging from 165-380° C. In another embodiment, a thickness of insulating layer 200 ranges between 5-20 μm. A portion of insulating layer 200 is removed by an etching process with a patterned photoresist layer, to expose conductive layer 196. Alternatively, a portion of insulating layer 200 is removed by LDA using laser 202 to expose conductive layer 196.

Figure 4L:
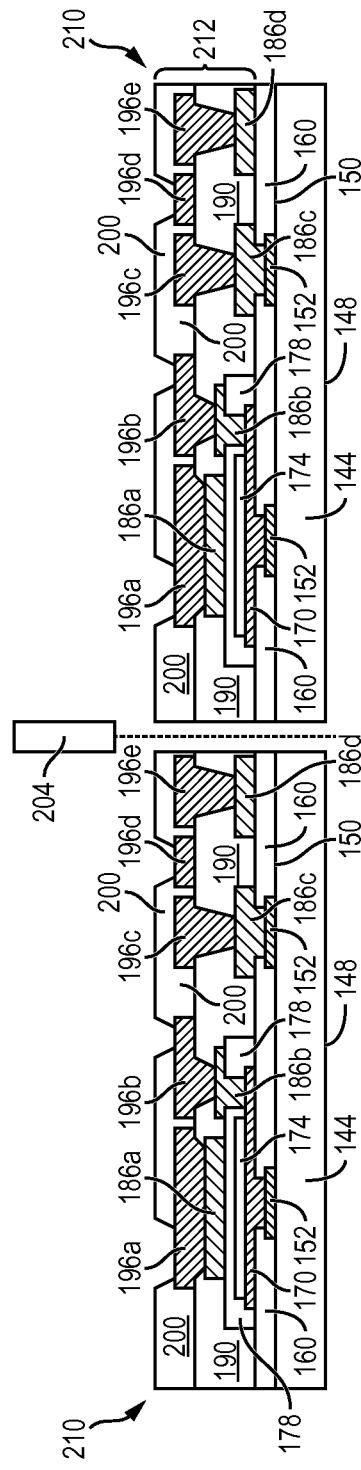

In FIG. 4l, the assembly from FIGS. 4a-4k is singulated through insulating layer 200, insulating layer 190, insulating layer 160, and saw street 146 with saw blade or laser cutting tool 204 to create individual IPD die 210. The structures described in FIGS. 4c-4k, including conductive layers 170, 186, and 196, resistive layer 174, and insulating layers 160, 178, 190, and 200 constitute a plurality of passive circuit elements or IPDs 212 formed within IPD die 210. The IPDs 212 provide the electrical characteristics needed for high frequency applications, such as resonators, high-pass filters, low-pass filters, band-pass filters, symmetric Hi-Q resonant transformers, and tuning capacitors. The IPDs 212 can be used as front-end wireless RF components, which can be positioned between the antenna and transceiver. The inductors can be hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

Figure 5A:
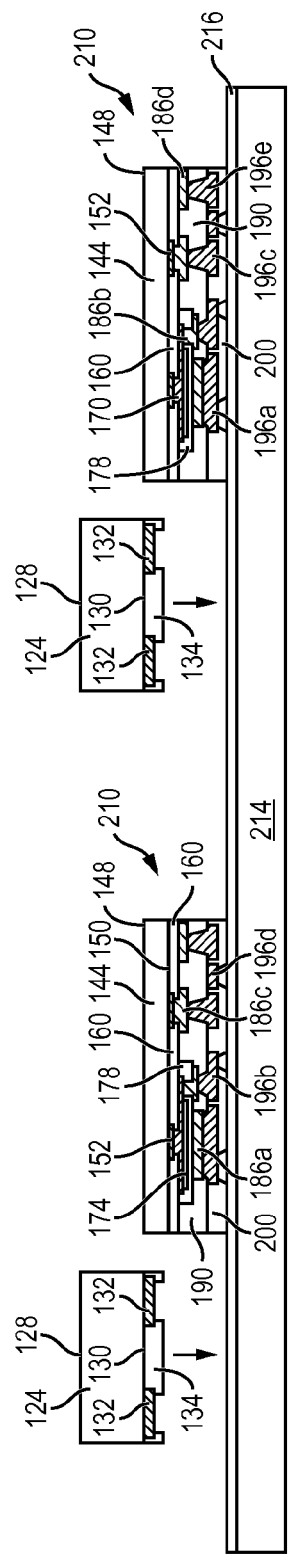

FIGS. 5a-5i illustrate, in relation to FIGS. 1, and 2a-2c, a process of forming a conductive bridge and a fan out RDL over semiconductor die and IPDs. In FIG. 5a, a substrate or carrier 214 contains sacrificial base material such as silicon, polymer, beryllium oxide, or other suitable low-cost, rigid material for structural support. An interface layer or double-sided tape 216 is formed over carrier 214 as a temporary adhesive bonding film or etch-stop layer. Leading with insulating layer 200, IPD die 210 from FIG. 4l are positioned over and mounted to interface layer 216 and carrier 214 using a pick and place operation. Leading with insulating layer 134, semiconductor die 124 from FIG. 3c are positioned over and mounted to interface layer 216 and carrier 214 using a pick and place operation. Insulating layer 200 is substantially coplanar with insulating layer 134.

Figure 5B:
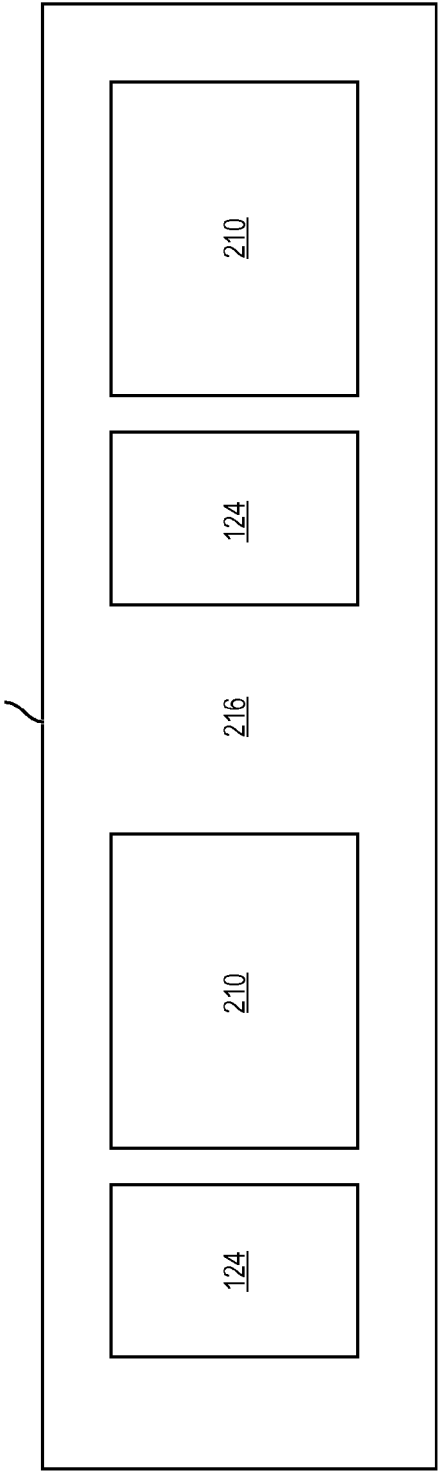

FIG. 5b shows a top or plan view of the assembly from FIG. 5a. IPD die 210 is mounted next to semiconductor die 124 over carrier 214 with interface layer 216. IPD die 210 is adjacent to semiconductor die 124 and IPD die 210 is separated from semiconductor die 124 by a space or gap between IPD die 210 and semiconductor die 124.

FIG. 5c shows the assembly from FIGS. 5a-5b, focusing on a single IPD die 210, and a single semiconductor die 124. An encapsulant or molding compound 220 is deposited over IPD die 210, semiconductor 124, and carrier 214 using a paste printing, compressive molding, transfer molding, liquid encapsulant molding, vacuum lamination, spin coating, or other suitable applicator. Encapsulant 220 can be polymer composite material, such as epoxy resin with filler, epoxy acrylate with filler, or polymer with proper filler. Encapsulant 220 is non-conductive and environmentally protects the semiconductor device from external elements and contaminants. Encapsulant 220 has high volume resistivity, (e.g., greater than E14 Ohm-cm), low dielectric constant (e.g., less than 4.0), and low loss tangent (e.g., less than 0.05).

In FIG. 5d, carrier 214, and interface layer 216 are removed by chemical etching, mechanical peeling, CMP, mechanical grinding, thermal bake, UV light, laser scanning, or wet stripping to expose a surface of encapsulant 220, insulating layer 134, conductive layer 132, insulating layer 200, and conductive layer 196. Encapsulant 220 provides structural support for semiconductor die 124 and IPD die 210 after removal of carrier 214.

Figure 5E:
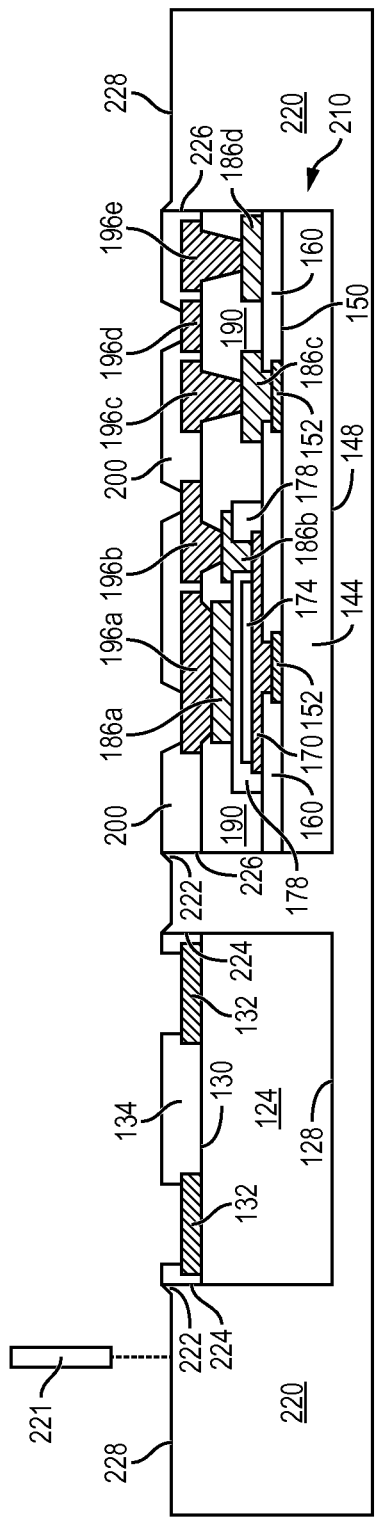

In FIG. 5e, encapsulant 220 is etched using a plasma process, wet chemical etching, or photoresist developing process to remove a portion of a surface of the encapsulant 220. Alternatively, a portion of encapsulant 220 is removed by LDA using laser 221. In one embodiment, a portion of the encapsulant 220, support structure 222, maintains coverage over a sidewall 224 of insulating layer 134. Support structure 222 also maintains coverage over a sidewall 226 of IPD die 210. Encapsulant 220 also has a surface 228 that is vertically offset from an exposed surface of insulating layer 134 and insulating layer 200.

Figure 5F:
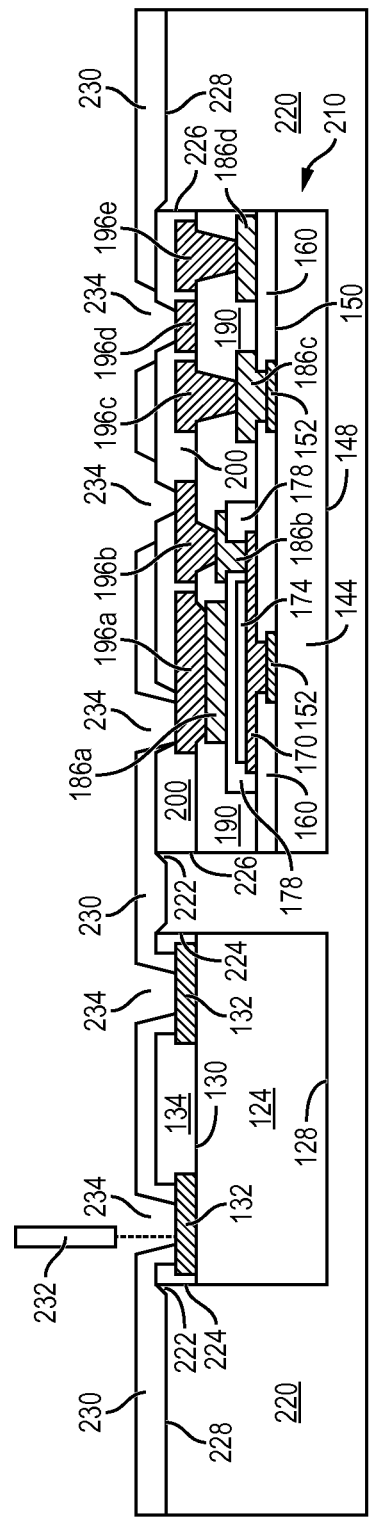

In FIG. 5f, an insulating or passivation layer 230 is formed over encapsulant 220, semiconductor die 124, and IPD die 210 using PVD, CVD, printing, spin coating, spray coating, screen printing or lamination. Insulating layer 230 contains one or more layers of SiO2, Si3N4, SiON, Ta2O5, Al2O3, organic polymer, or other material having similar insulating and structural properties. The thickness of insulating layer 230 can be adjusted according to the design and function of IPD die 210. In one embodiment, the thickness of insulating layer 230 ranges between 5-25 µm. A portion of insulating layer 230 is removed by an etching process with a patterned photoresist layer, to expose a portion of conductive layers 132 and 196. Alternatively, a portion of insulating layer 230 is removed by LDA using laser 232 to expose a portion of conductive layer 132 and conductive layer 196. The resulting vias 234 can have a straight, sloped, angled, curved, or stepped sidewall.

Figure 5G:
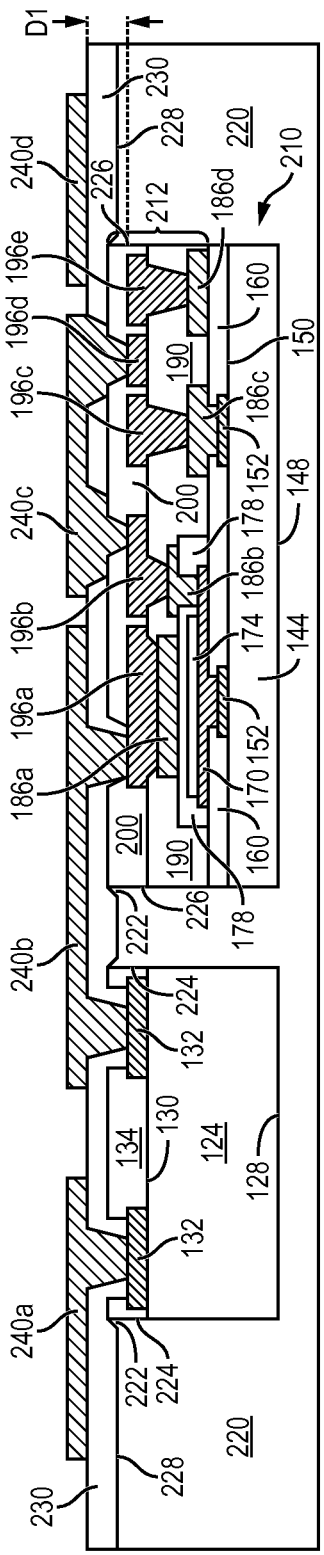

In FIG. 5g, an electrically conductive layer 240 is formed over insulating layer 230, insulating layer 200, conductive layer 132, and conductive layer 196 using patterning with PVD, CVD, sputtering, electrolytic plating, electroless plating process, or other suitable metal deposition process to form individual portions or sections 240a-240d. Conductive layer 240 can be one or more layers of Al, Cu, Sn, Ni, Au, Ag, or other suitable electrically conductive material. In one embodiment, conductive layer 240 is deposited using a suitable selective copper plating process, such as ion milling or back sputtering, with a suitable seed alloy such as TiCu, TiWCu, or TaNC. In another embodiment, a thickness of conductive layer 240 ranges between 3-12 µm. A portion of conductive layer 240 extends horizontally along insulating layer 230 and parallel to active surface 130 of semiconductor die 124 to laterally redistribute the electrical interconnect to conductive layers 132 and 196. Conductive layer 240 operates as a fan-out RDL, providing lateral redistribution for the electrical signals of semiconductor die 124 and IPD die 210. The individual portions of conductive layer 240a-240d can be electrically common or electrically isolated depending on the connectivity of the individual semiconductor die 124 and IPD die 210. A portion of conductive layer 240a extends through insulating layer 230 to electrically connect conductive layer 240a to conductive layer 132 of semiconductor die 124. A portion of conductive layer 240b extends through insulating layer 230 to electrically connect conductive layer 240b to conductive layer 132 of semiconductor die 124 and conductive layer 196a of IPD die 210.

A portion of conductive layer 240c extends through insulating layers 230 and 200 to electrically connect conductive layer 240c to conductive layers 196b and 196d. A portion of conductive layer 240c also extends horizontally along insulating layer 230, and operates as a stacked-inductor bridge or conductive bridge providing electrical interconnection between conductive layers 196b and 196d. Thus, conductive layer 240c is electrically connected to the top inductor wing 196c-196e and semiconductor die 144. The distance or gap D1 between the horizontal portions of conductive layers 240a-240d and conductive layers 196a-196e can be controlled or adjusted by increasing or decreasing the thickness of insulating layer 230 according to the design and function of IPD die 210. Semiconductor packages, particularly in high-current applications, are prone to leakage current between conductive layers or devices. Increasing the distance D1 by increasing the thickness of insulating layer 230 provides the ability to reduce leakage current between conductive layers 240a-240d and the IPDs 212, semiconductor die 144, and semiconductor die 124.

Figure 5H:
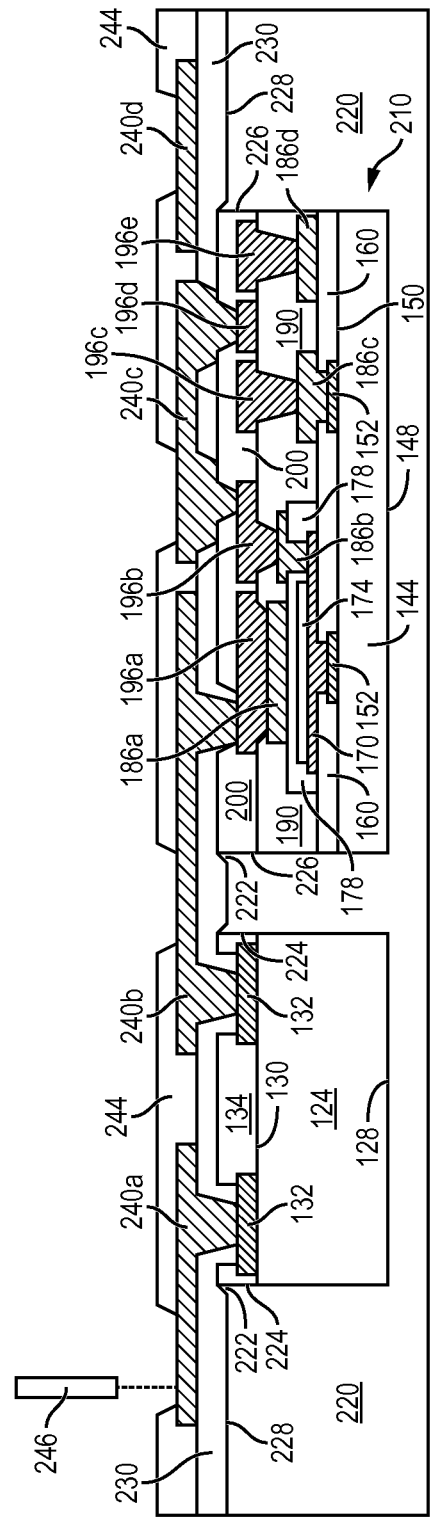

In FIG. 5h, an insulating or passivation layer 244 is formed over insulating layer 230 and conductive layer 240 using PVD, CVD, printing, spin coating, spray coating, screen printing or lamination. Insulating layer 244 contains one or more layers of SiO2, Si3N4, SiON, Ta2O5, Al2O3, organic polymer, or other material having similar insulating and structural properties. A portion of insulating layer 244 is removed by an etching process with a patterned photoresist layer to expose conductive layer 240. Alternatively, a portion of insulating layer 244 is removed by LDA using laser 246 to expose conductive layer 240.

FIG. 5i shows the assembly from FIGS. 5a-5h with multiple IPD die 210 and semiconductor die 124. An electrically conductive bump material is deposited over the exposed conductive layer 240 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 240 using a suitable attachment or bonding process. In one embodiment, the bump material is reflowed by heating the material above its melting point to form balls or bumps 248. In some applications, bumps 248 are reflowed a second time to improve electrical contact to conductive layer 240. An under bump metallization (UBM) layer can be formed under bumps 248. Bumps 248 can also be compression bonded to conductive layer 240. Bumps 248 represent one type of interconnect structure that can be formed over conductive layer 240. The interconnect structure can also use stud bump, micro bump, or other electrical interconnect.

Collectively, insulating layers 230, and 244, conductive layer 240, and bumps 248 constitute a build-up interconnect structure 249. Additional conductive and insulating layers may be formed over insulating layer 244 prior to forming bumps 248, to provide additional vertical and horizontal electrical connectivity across the package according to the design and functionality of the semiconductor device. The assembly from FIGS. 5a-5i is singulated through insulating layer 244, insulating layer 230, and encapsulant 220 with saw blade or laser cutting tool 250 to create individual semiconductor packages or Fo-WLCSP 252.

FIG. 6 shows Fo-WLCSP 252 after singulation. Conductive layer 152 of semiconductor die 144 is electrically connected to conductive layer 170. Conductive layer 170, resistive layer 174, insulating layer 178, and conductive layer 186a form a MIM capacitor. Conductive layer 186b is electrically connected to conductive layer 170. Conductive layers 186c-186d constitute a bottom inductor wing formed over and within a footprint of semiconductor die 144.

Conductive layer 196a is electrically connected to and aligned with conductive layer 186a. Conductive layer 196b is electrically connected to and aligned with conductive layer 186b. Conductive layer 196c is electrically connected to and aligned with conductive layer 186c. Conductive layer 196e is electrically connected to and aligned with conductive layer 186d. Conductive layers 196c-196e constitute a top inductor wing. The process of forming IPDs externally to semiconductor die is prone to cause some degree of misalignment which can degrade the IPDs, particularly when the IPDs are formed over semiconductor die and also separately during subsequent formation of RDLs. The top inductor wing 196c-196e is stacked over and aligned along the entire path or coil of the bottom inductor wing 186c-186d within semiconductor die 210 for higher quality and reliable IPDs.

Conductive layers 170, 186, and 196, resistive layer 174, and insulating layers 160, 178, 190, and 200 constitute a plurality of passive circuit elements or IPDs 212 formed over semiconductor die 144. Semiconductor die 144 are singulated to create individual IPD die 210. IPD die 210 and semiconductor die 124 are mounted over a temporary carrier 214. An encapsulant 220 is formed over semiconductor die 124, semiconductor die 144, and carrier 214. Encapsulant 220 provides structural support and stiffness during RDL and bump formation. An insulating layer 230 is formed over encapsulant 220, semiconductor die 124, and IPD die 210. The thickness of insulating layer 230 can be adjusted according to the design and functionality of IPD die 210.

An electrically conductive layer 240 is formed over insulating layer 230, IPD die 210 and semiconductor die 124. Conductive layer 240 operates as a fan-out RDL, providing lateral redistribution for the electrical signals of semiconductor die 124 and IPD die 210. The individual portions of conductive layer 240a-240d can be electrically common or electrically isolated depending on the connectivity of the individual semiconductor die 124 and IPD die 210. Conductive layer 240a is electrically connected to conductive layer 132 of semiconductor die 124. Conductive layer 240b is electrically connected to conductive layer 132 of semiconductor die 124 and conductive layer 196a of IPD die 210. Conductive layer 240c is electrically connected to conductive layers 196b and 196d. A portion of conductive layer 240c extends horizontally along insulating layer 230, and operates as a stacked-inductor bridge or conductive bridge providing electrical interconnection between conductive layers 196b and 196d. Thus, conductive layer 240c is electrically connected to the top inductor wing 196c-196e and semiconductor die 144. The distance or gap D1 between the horizontal portions of conductive layers 240a-240d and conductive layers 196a-196e can be controlled or adjusted by increasing or decreasing the thickness of insulating layer 230 according to the design and function of IPD die 210. Semiconductor packages, particularly in high-current applications, are prone to leakage current between conductive layers or devices. Increasing the distance D1 by increasing the thickness of insulating layer 230 provides the ability to reduce leakage current between conductive layers 240a-240d and the IPDs 212, semiconductor die 144, and semiconductor die 124.

Figure 7:
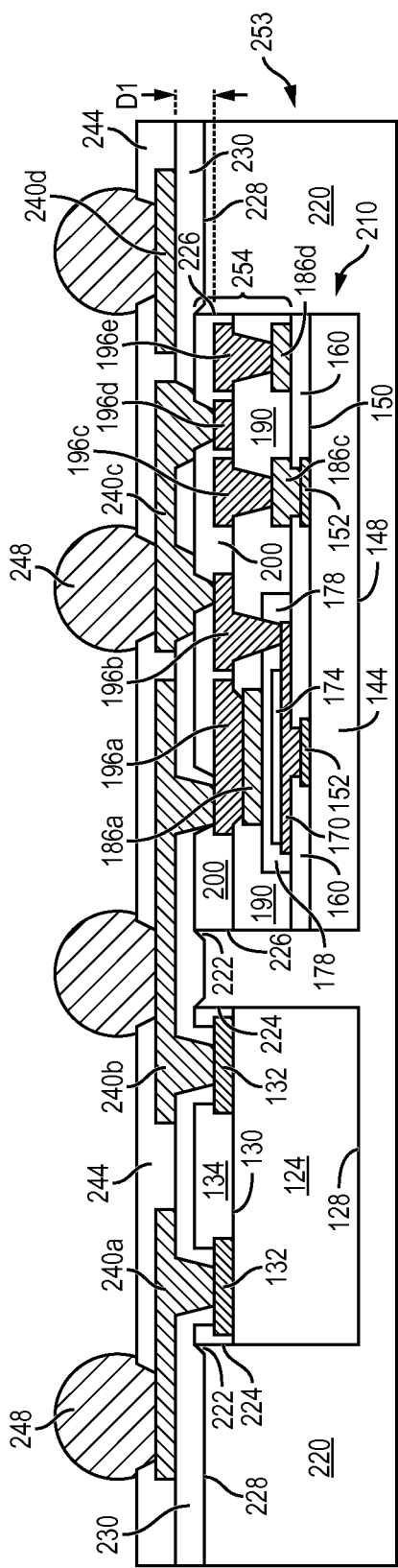
FIG. 7 illustrates a semiconductor package with a conductive bridge and a redistribution layer formed over IPDs with a top inductor wing directly connected to a capacitor.

FIG. 7 shows Fo-WLCSP 253, an alternate embodiment, similar to the assembly shown in FIG. 6, absent the formation of conductive layer 186b. Conductive layer 196b is mechanically and electrically connected directly to conductive layer 170. Directly connecting conductive layer 196b to conductive layer 170, without an intervening conductive layer 186b, allows for a higher degree of uniformity for insulating layer 178 by avoiding the need for an ion milling or back sputtering process prior to depositing conductive layer 186b. Directly connecting conductive layer 196b to conductive layer 170, without an intervening conductive layer 186b, also reduces plasma damage on insulating layer 178, which acts as a capacitor dielectric material.

Figure 8A:
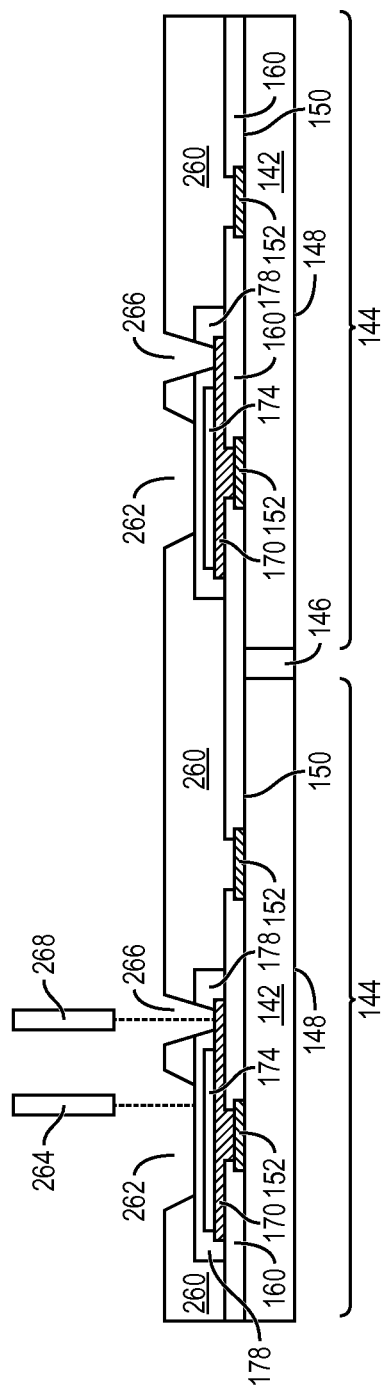
FIGS. 8a-8c illustrate a process of forming IPDs over a semiconductor die with a single inductor.
Figure 8B:
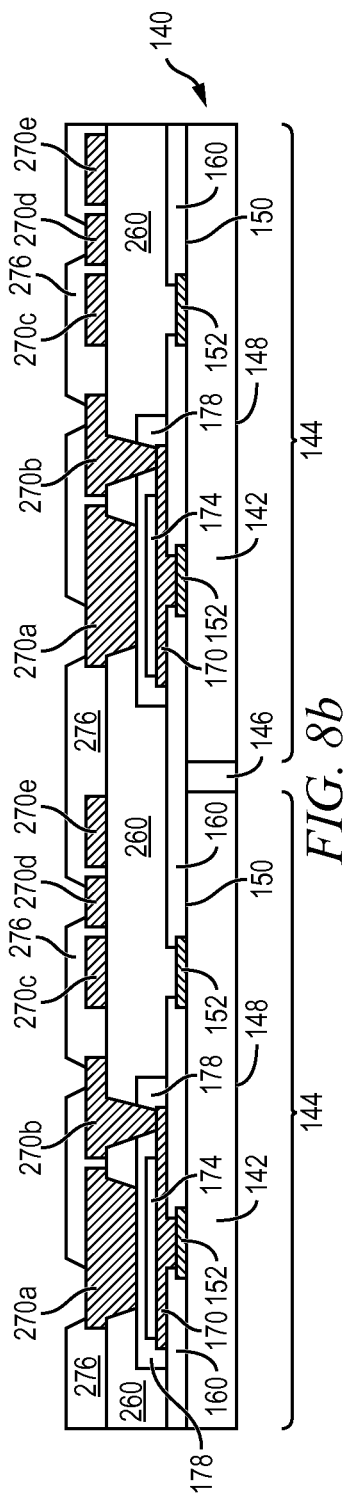
Figure 8C:
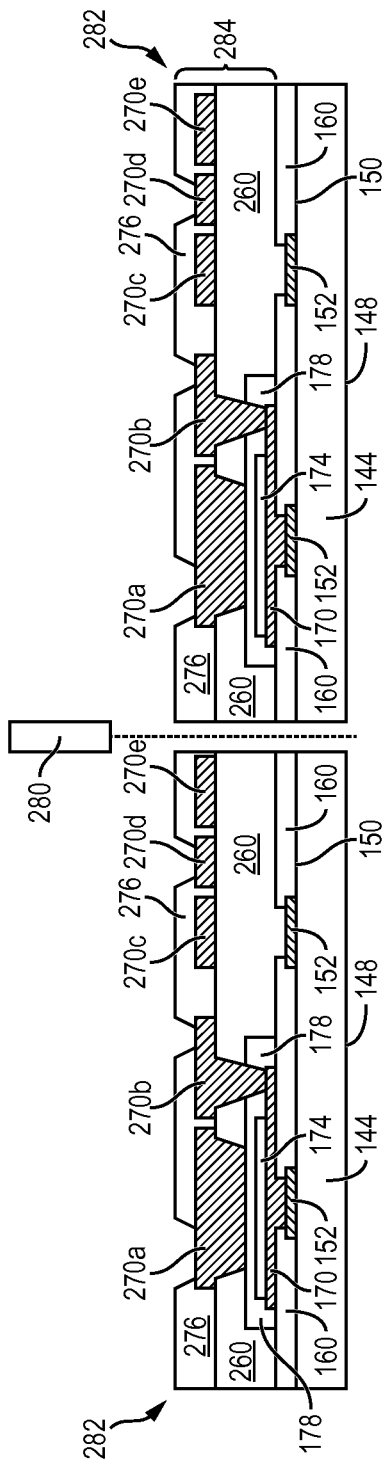

FIGS. 8a-8c illustrate, in relation to FIGS. 1, and 2a-2c, a process of forming IPDs over a semiconductor die with a single inductor. In FIG. 8a, continuing from FIG. 4e, an insulating layer 260 is formed over insulating layer 178, insulating layer 160, and conductive layer 152 using PVD, CVD, printing, spin coating, spray coating, screen printing or lamination. Insulating layer 260 contains one or more layers of SiO2, Si3N4, SiON, Ta2O5, Al2O3, organic polymer, or other material having similar insulating and structural properties. In one embodiment, insulating layer 260 undergoes a curing process after being deposited, with a curing temperature ranging from 165-380° C. In another embodiment, a thickness of insulating layer 260 ranges between 5-20 µm. A portion of insulating layer 260 is removed by an etching process with a patterned photoresist layer to create opening 262 and to expose a portion of insulating layer 178 over resistive layer 174. Alternatively, a portion of insulating layer 260 is removed by LDA using laser 264 to create opening 262 and to expose a portion of insulating layer 178 over resistive layer 174. A portion of insulating layer 260 and insulating layer 178 are removed by an etching process with a patterned photoresist layer to create opening 266 and to expose a portion of conductive layer 170 outside a footprint of resistive layer 174. Alternatively, a portion of insulating layer 260 is removed by LDA using laser 268 to create opening 266 and to expose a portion of conductive layer 170 outside a footprint of resistive layer 174. Openings 262 and 266 can have straight, tapered, or stepped sidewalls.

In FIG. 8b, an electrically conductive layer 270 is formed over insulating layers 260, and 178, and conductive layer 170 using patterning with PVD, CVD, sputtering, electrolytic plating, electroless plating process, or other suitable metal deposition process to form individual portions or sections 196a-196e. Conductive layer 270 includes one or more layers of Al, Cu, Sn, Ni, Au, Ag, or other suitable electrically conductive material. In one embodiment, conductive layer 270 is deposited using a suitable selective copper plating process, such as ion milling or back sputtering, with a suitable seed alloy such as TiCu, TiWCu, or TaNC. In another embodiment, conductive layer 270 has a thickness between 3 and 15 µm.

The individual portions of conductive layer 270a-270e can be electrically common or electrically isolated according to the design and function of the individual semiconductor die 144. A portion of conductive layer 270a extends vertically through opening 262, and in one embodiment, conductive layer 170, resistive layer 174, insulating layer 178, and conductive layer 270a form a MIM capacitor. A portion of conductive layer 270b extends vertically through opening 266 to electrically connect conductive layer 270b to conductive layer 170. Directly connecting conductive layer 270b to conductive layer 170, without an intervening conductive layer, for example conductive layer 186b in FIG. 6, allows for a higher degree of uniformity for insulating layer 178 by avoiding the need for an ion milling or back sputtering process prior to depositing an intervening conductive layer, and reduces plasma damage on insulating layer 178, which acts as a capacitor dielectric material. Additionally, manufacturing cost and time is reduced by avoiding formation of an intervening conductive layer such as conductive layer 186, shown in FIG. 6. The individual sections of conductive layer 270c-270e can be wound or coiled in plan-view to produce or exhibit the desired characteristics of an inductor. Conductive layers 270c-270e form an inductor wing formed over and within a footprint of semiconductor die 144.

An insulating or passivation layer 276 is formed over insulating layer 260 and conductive layer 270 using PVD, CVD, printing, spin coating, spray coating, screen printing or lamination. Insulating layer 276 contains one or more layers of SiO2, Si3N4, SiON, Ta2O5, Al2O3, organic polymer, or other material having similar insulating and structural properties. In one embodiment, insulating layer 276 undergoes a curing process after deposition, with a curing temperature ranging from 165-380° C. In another embodiment, a thickness of insulating layer 276 ranges between 5-20 µm. A portion of insulating layer 276 is removed by an etching process with a patterned photoresist layer, to expose conductive layer 270. Alternatively, a portion of insulating layer 276 is removed by LDA using laser 278 to expose conductive layer 270.

In FIG. 8c, the assembly from FIGS. 4a-4e and 8a-8b is singulated through insulating layer 276, insulating layer 260, insulating layer 160, and saw street 146 with saw blade or laser cutting tool 280 to create individual IPD die 282. The structures described in FIGS. 4c-4e, and 8a-8c, including conductive layers 170, and 270, resistive layer 174, and insulating layers 160, 178, 260, and 276 constitute a plurality of passive circuit elements or IPDs 284 formed within IPD die 282. The IPDs 284 provide the electrical characteristics needed for high frequency applications, such as resonators, high-pass filters, low-pass filters, band-pass filters, symmetric Hi-Q resonant transformers, and tuning capacitors. The IPDs 284 can be used as front-end wireless RF components, which can be positioned between the antenna and transceiver. The inductors can be hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun is dedicated for a frequency band of operation of the quad-band device. A typical RF system requires multiple IPDs and other high frequency circuits in one or more semiconductor packages to perform the necessary electrical functions.

Figure 9C:
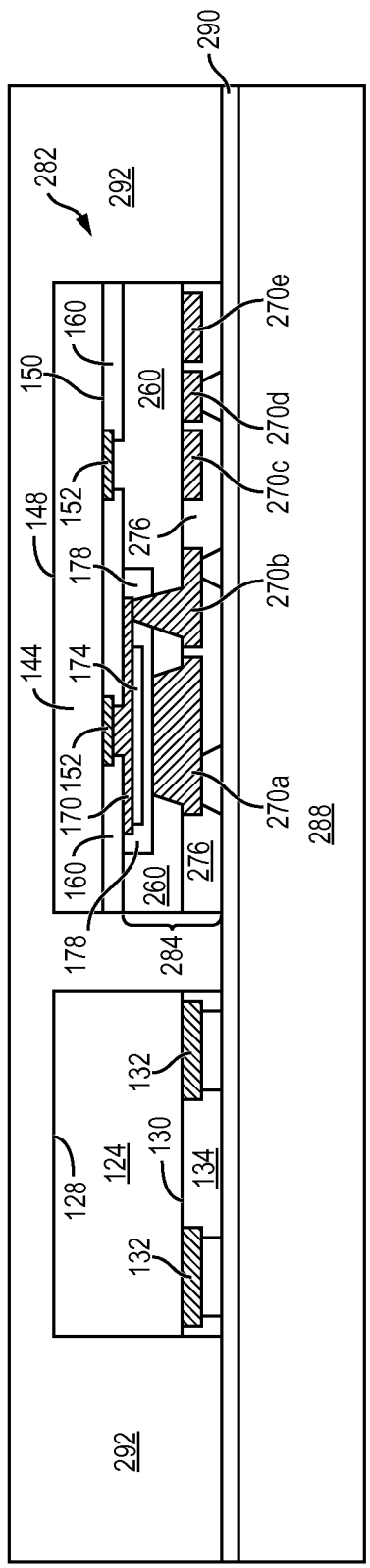

FIGS. 9a-9i illustrate, in relation to FIGS. 1, and 2a-2c, a process of forming a conductive bridge and a fan out RDL over semiconductor die and IPDs with a single inductor. In FIG. 9a, a substrate or carrier 288 contains sacrificial base material such as silicon, polymer, beryllium oxide, or other suitable low-cost, rigid material for structural support. An interface layer or double-sided tape 290 is formed over carrier 288 as a temporary adhesive bonding film or etch-stop layer. Leading with insulating layer 276, IPD die 282 from FIG. 8c are positioned over and mounted to carrier 288 with interface layer 290 using a pick and place operation. Leading with insulating layer 134, semiconductor die 124 from FIG. 3c are positioned over and mounted to carrier 288 with interface layer 290 using a pick and place operation. Insulating layer 276 is substantially coplanar with insulating layer 134.

FIG. 9b shows a top or plan view of the assembly from FIG. 9a. IPD die 282 is mounted next to semiconductor die 124 over carrier 288 with interface layer 290. IPD die 282 is adjacent to semiconductor die 124 and IPD die 282 is separated from semiconductor die 124 by a space or gap between IPD die 282 and semiconductor die 124.

FIG. 9c shows the assembly from FIGS. 9a-9b, focusing on a single IPD die 282, and a single semiconductor die 124. An encapsulant or molding compound 292 is deposited over IPD die 282, semiconductor 124, and carrier 288 using a paste printing, compressive molding, transfer molding, liquid encapsulant molding, vacuum lamination, spin coating, or other suitable applicator. Encapsulant 292 can be polymer composite material, such as epoxy resin with filler, epoxy acrylate with filler, or polymer with proper filler. Encapsulant 292 is non-conductive and environmentally protects the semiconductor device from external elements and contaminants. Encapsulant 292 has high volume resistivity, (e.g., greater than E14 Ohm-cm), low dielectric constant (e.g., less than 4.0), and low loss tangent (e.g., less than 0.05).

Figure 9D:
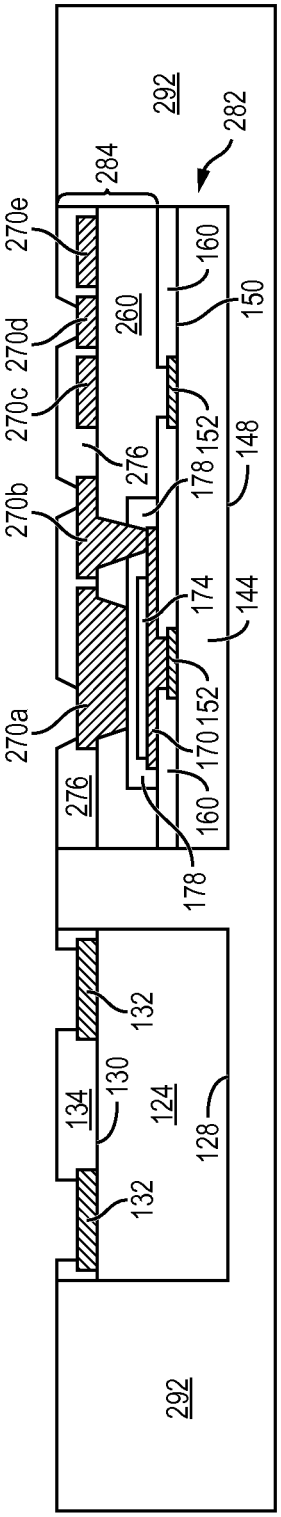

In FIG. 9d, carrier 288, and interface layer 290 are removed by chemical etching, mechanical peeling, CMP, mechanical grinding, thermal bake, UV light, laser scanning, or wet stripping to expose a surface of encapsulant 292, insulating layer 134, conductive layer 132, insulating layer 276, and conductive layer 270. Encapsulant 292 provides structural support for semiconductor die 124 and IPD die 282 after removal of carrier 288.

Figure 9E:
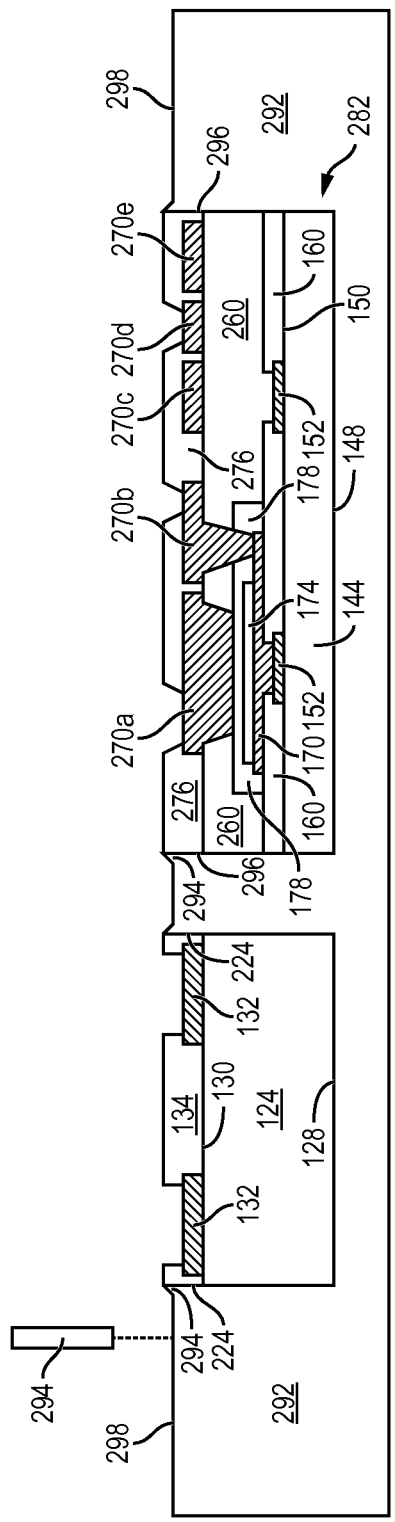

In FIG. 9e, encapsulant 292 is etched using a plasma process, wet chemical etching, or photoresist developing process to remove a portion of a surface of the encapsulant 292. Alternatively, a portion of encapsulant 292 is removed by LDA using laser 294. In one embodiment, a portion of the encapsulant 292, support structure 294, maintains coverage over a sidewall 224 of insulating layer 134. Support structure 294 also maintains coverage over a sidewall 296 of IPD die 282. Encapsulant 292 also has a surface 298 that is vertically offset from an exposed surface of insulating layer 134 and insulating layer 276.

Figure 9F:
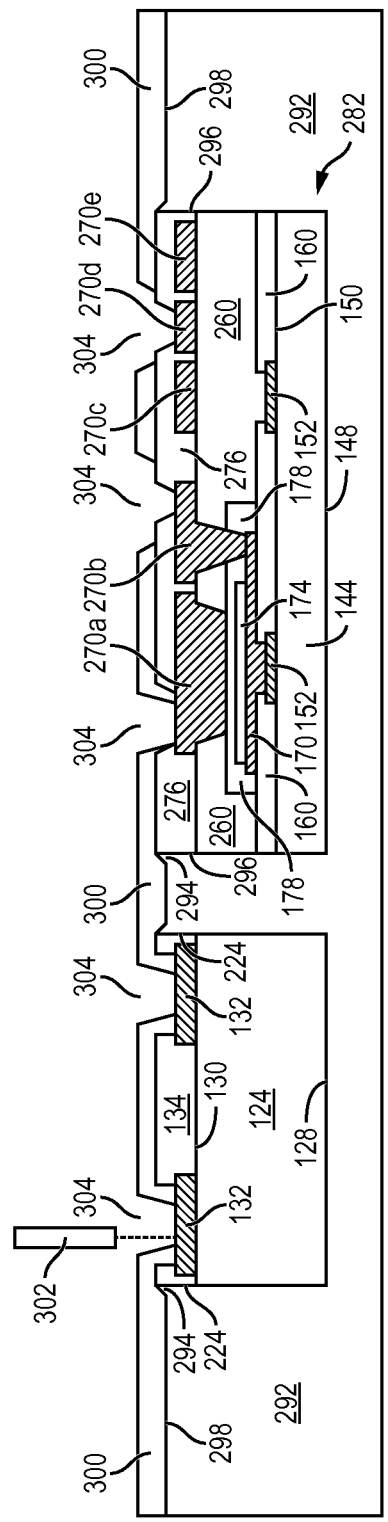

In FIG. 9f, an insulating or passivation layer 300 is formed over encapsulant 292, semiconductor die 124, and IPD die 282 using PVD, CVD, printing, spin coating, spray coating, screen printing or lamination. Insulating layer 300 contains one or more layers of $SiO_2$, $Si_3N_4$, SiON, $Ta_2O_5$, $Al_2O_3$, organic polymer, or other material having similar insulating and structural properties. The thickness of insulating layer 300 can be adjusted according to the design and function of IPD die 282. In one embodiment, the thickness of insulating layer 300 ranges between 5-25 µm. A portion of insulating layer 300 is removed by an etching process with a patterned photoresist layer, to expose a portion of conductive layers 132 and 270. Alternatively, a portion of insulating layer 300 is removed by LDA using laser 302 to expose a portion of conductive layer 132 and conductive layer 270. The resulting vias 304 can have a straight, sloped, angled, curved, or stepped sidewall.

Figure 9G:
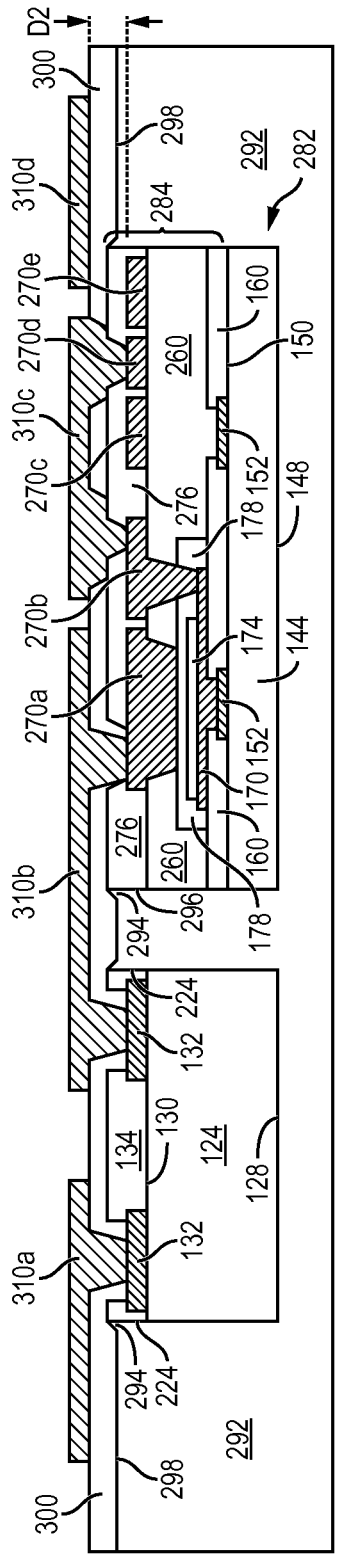

In FIG. 9g, an electrically conductive layer 310 is formed over insulating layer 300, insulating layer 276, conductive layer 132, and conductive layer 270 using patterning with PVD, CVD, sputtering, electrolytic plating, electroless plating process, or other suitable metal deposition process to form individual portions or sections 310a-310d. Conductive layer 310 can be one or more layers of Al, Cu, Sn, Ni, Au, Ag, or other suitable electrically conductive material. In one embodiment, a thickness of conductive layer 310 ranges between 3-12 µm. A portion of conductive layer 310 extends horizontally along insulating layer 300 and parallel to active surface 130 of semiconductor die 124 to laterally redistribute the electrical interconnect to conductive layers 132 and 270. Conductive layer 310 operates as a fan-out RDL, providing lateral redistribution for the electrical signals of semiconductor die 124 and IPD die 282. The individual portions of conductive layer 310a-310d can be electrically common or electrically isolated depending on the connectivity of the individual semiconductor die 124 and IPD die 282. A portion of conductive layer 310a extends through insulating layer 300 to electrically connect conductive layer 310a to conductive layer 132 of semiconductor die 124. A portion of conductive layer 310b extends through insulating layer 300 to electrically connect conductive layer 310b to conductive layer 132 of semiconductor die 124 and conductive layer 270a of IPD die 282.

A portion of conductive layer 310c extends through insulating layers 300 and 276 to electrically connect conductive layer 310c to conductive layers 270b and 270d. A portion of conductive layer 310c also extends horizontally along insulating layer 300, and operates as a stacked-inductor bridge or conductive bridge providing electrical interconnection between conductive layers 270b and 270d. Thus, conductive layer 310c is electrically connected to the inductor wing 270c-270e and semiconductor die 144. The distance or gap D2 between the horizontal portions of conductive layers 310a-310d and conductive layers 270a-270e can be controlled or adjusted by increasing or decreasing the thickness of insulating layer 300 according to the design and function of IPD die 282. Semiconductor packages, particularly in high-current applications, are prone to leakage current between conductive layers or devices. Increasing the distance D2 by increasing the thickness of insulating layer 300 provides the ability to reduce leakage current between conductive layers 310a-310d and the IPDs 284, semiconductor die 144, and semiconductor die 124.

Figure 9H:
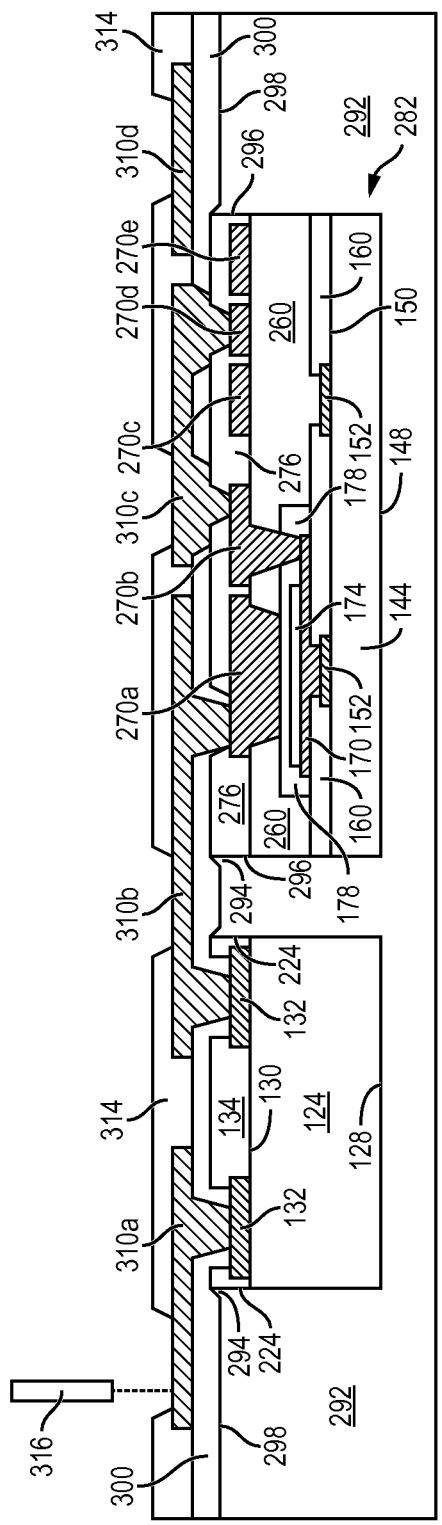

In FIG. 9h, an insulating or passivation layer 314 is formed over insulating layer 300 and conductive layer 310 using PVD, CVD, printing, spin coating, spray coating, screen printing or lamination. Insulating layer 314 contains one or more layers of SiO2, Si3N4, SiON, Ta2O5, Al2O3, organic polymer, or other material having similar insulating and structural properties. A portion of insulating layer 314 is removed by an etching process with a patterned photoresist layer to expose conductive layer 310. Alternatively, a portion of insulating layer 314 is removed by LDA using laser 316 to expose conductive layer 310.

Figure 9I:
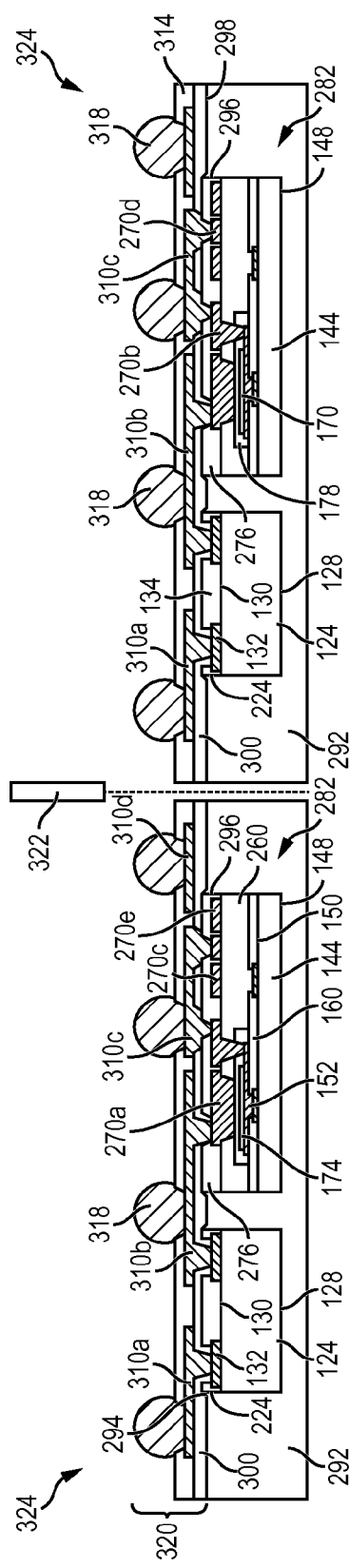

FIG. 9i shows the assembly from FIGS. 9a-9h with multiple IPD die 282 and semiconductor die 124. An electrically conductive bump material is deposited over the exposed conductive layer 310 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 310 using a suitable attachment or bonding process. In one embodiment, the bump material is reflowed by heating the material above its melting point to form balls or bumps 318. In some applications, bumps 318 are reflowed a second time to improve electrical contact to conductive layer 310. A UBM layer can be formed under bumps 318. Bumps 318 can also be compression bonded to conductive layer 310. Bumps 318 represent one type of interconnect structure that can be formed over conductive layer 310. The interconnect structure can also use stud bump, micro bump, or other electrical interconnect.

Collectively, insulating layers 300, and 314, conductive layer 310, and bumps 318 constitute a build-up interconnect structure 320. Additional conductive and insulating layers may be formed over insulating layer 314 prior to forming bumps 318, to provide additional vertical and horizontal electrical connectivity across the package according to the design and functionality of the semiconductor device. The assembly from FIGS. 9a-9i is singulated through insulating layer 314, insulating layer 300, and encapsulant 292 with saw blade or laser cutting tool 322 to create individual semiconductor packages or Fo-WLCSP 324.

Figure 10:
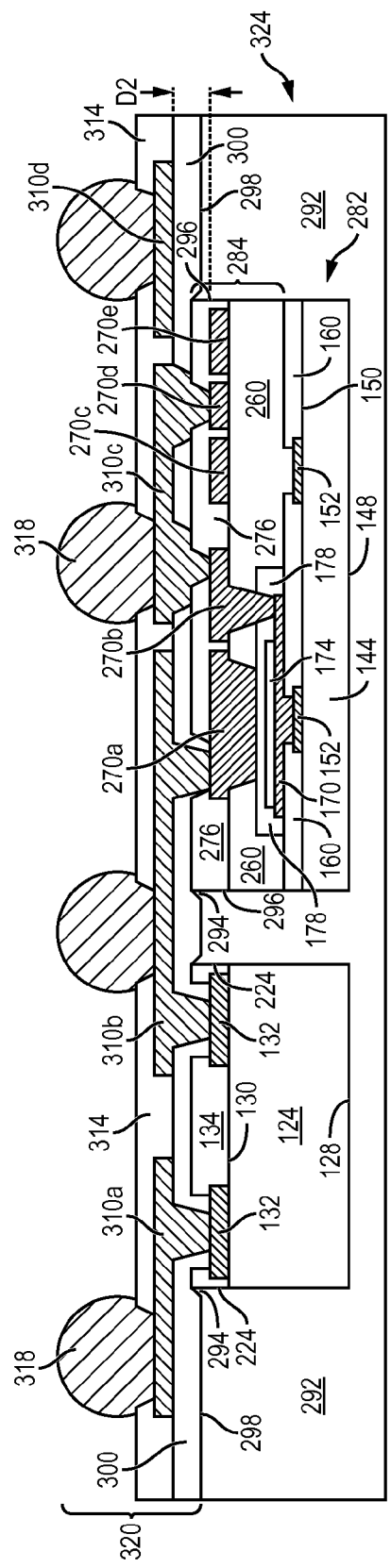
FIG. 10 illustrates a semiconductor package with a conductive bridge and a fan out RDL over semiconductor die and a single inductor.

FIG. 10 shows Fo-WLCSP 324 after singulation. Fo-WLCSP 324 is similar to the assembly shown in FIG. 6, absent the formation of conductive layer 186. Conductive layer 170, resistive layer 174, insulating layer 178, and conductive layer 270a form a MIM capacitor. Conductive layer 270b is electrically connected to conductive layer 170. Directly connecting conductive layer 270b to conductive layer 170, without an intervening conductive layer, for example conductive layer 186b in FIG. 6, allows for a higher degree of uniformity for insulating layer 178 by avoiding the need for an ion milling or back sputtering process prior to depositing an intervening conductive layer, and reduces plasma damage on insulating layer 178, which acts as a capacitor dielectric material. Additionally, manufacturing cost and time is reduced by avoiding formation of an intervening conductive layer such as conductive layer 186, shown in FIG. 6. The individual sections of conductive layer 270c-270e can be wound or coiled in plan-view to produce or exhibit the desired characteristics of an inductor.

Conductive layers 170, and 270, resistive layer 174, and insulating layers 160, 178, 260, and 276 constitute a plurality of passive circuit elements or IPDs 284 formed over semiconductor die 144. Semiconductor die 144 are singulated to create individual IPD die 282. IPD die 282 and semiconductor die 124 are mounted over a temporary carrier 288. An encapsulant 292 is formed over semiconductor die 124, semiconductor die 144, and carrier 288. Encapsulant 292 provides structural support and stiffness during RDL and bump formation. An insulating layer 300 is formed over encapsulant 292, semiconductor die 124, and IPD die 282. The thickness of insulating layer 300 can be adjusted according to the design and functionality of IPD die 282.

An electrically conductive layer 310 is formed over insulating layer 300, IPD die 282, and semiconductor die 124. Conductive layer 310 operates as a fan-out RDL, providing lateral redistribution for the electrical signals of semiconductor die 124 and IPD die 282. The individual portions of conductive layer 310a-310d can be electrically common or electrically isolated depending on the connectivity of the individual semiconductor die 124 and IPD die 282. Conductive layer 310a is electrically connected to conductive layer 132 of semiconductor die 124. Conductive layer 310b is electrically connected to conductive layer 132 of semiconductor die 124 and conductive layer 270a of IPD die 282. Conductive layer 310c is electrically connected to conductive layers 270b and 270d. A portion of conductive layer 310c extends horizontally along insulating layer 300, and operates as a stacked-inductor bridge or conductive bridge providing electrical interconnection between conductive layers 270b and 270d. Thus, conductive layer 310c is electrically connected to the inductor wing 270c-270e and semiconductor die 144. The distance or gap D2 between the horizontal portions of conductive layers 310a-310d and conductive layers 270a-270e can be controlled or adjusted by increasing or decreasing the thickness of insulating layer 300 according to the design and function of IPD die 282. Semiconductor packages, particularly in high-current applications, are prone to leakage current between conductive layers or devices. Increasing the distance D2 by increasing the thickness of insulating layer 300 provides the ability to reduce leakage current between conductive layers 310a-310d and the IPDs 284, semiconductor die 144, and semiconductor die 124.

FIGS. 11a-11b illustrate, in relation to FIGS. 1, and 2a-2c, a process of forming a temporary planarization layer over an IPD and a semiconductor die. In FIG. 11a, continuing from FIG. 8b, a temporary planarization layer 330 is formed over insulating layer 276 and conductive layer 270 using spin coating, spray coating, printing, lamination, PVD, CVD, sintering, or thermal oxidation. In one embodiment, planarization layer 330 is applied as a blanket layer over the entire semiconductor wafer 140 without patterning. The planarization layer 330 contains one or more layers of SiO2, Si3N4, SiOn, Ta2O5, Al2O3, BCB, PI, PBO, polymer matrix dielectric film, organic polymer film, or other material having similar insulating or structural properties. In one embodiment, planarization layer 330 has a thickness of 1 μm. In FIG. 11b, the assembly is singulated through planarization layer 330, insulating layer 276, insulating layer 260, insulating layer 160, and saw street 146 with saw blade or laser cutting tool 332 to create individual IPD die 340 with planarization layer 330 formed over IPD die 340.

The structures described in FIGS. 4c-4e, 8a-8b, and 11a-11b, including conductive layers 170, and 270, resistive layer 174, and insulating layers 160, 178, 260, and 276 constitute a plurality of passive circuit elements or IPDs 342 formed within IPD die 340. The IPDs 342 provide the electrical characteristics needed for high frequency applications, such as resonators, high-pass filters, low-pass filters, band-pass filters, symmetric Hi-Q resonant transformers, and tuning capacitors. The IPDs 342 can be used as front-end wireless RF components, which can be positioned between the antenna and transceiver. The inductors can be hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun is dedicated for a frequency band of operation of the quad-band device. A typical RF system requires multiple IPDs and other high frequency circuits in one or more semiconductor packages to perform the necessary electrical functions.

Figure 12A:
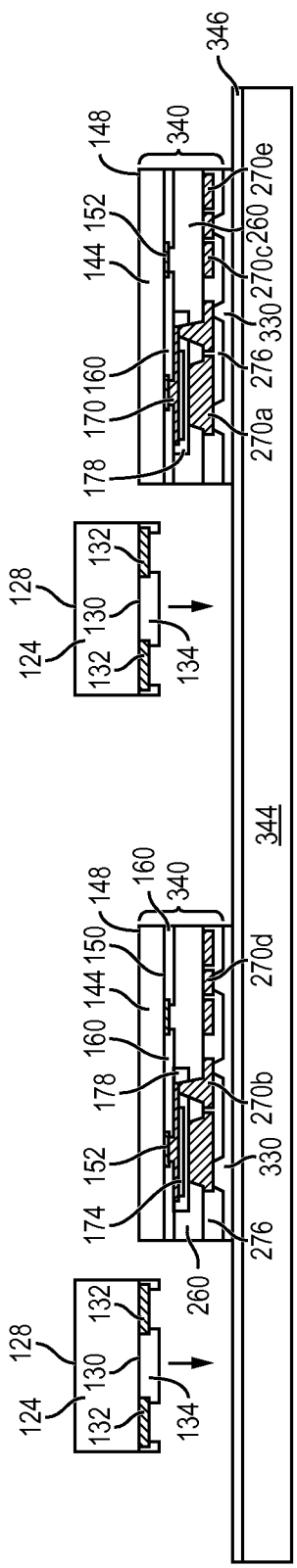
FIGS. 12a-12h illustrate a process of forming a Fo-WLCSP with a conductive bridge and an RDL formed over IPDs and semiconductor die with a vertical offset.

FIGS. 12a-12h, illustrate, in relation to FIGS. 1, and 2a-2c, a process of forming a Fo-WLCSP with a conductive bridge and an RDL formed over IPDs and semiconductor die with a vertical offset. In FIG. 12a, a substrate or carrier 344 contains sacrificial base material such as silicon, polymer, beryllium oxide, or other suitable low-cost, rigid material for structural support. An interface layer or double-sided tape 346 is formed over carrier 344 as a temporary adhesive bonding film or etch-stop layer. Leading with insulating layer 276, IPD die 340 from FIG. 11b are positioned over and mounted to carrier 344 with interface layer 346 using a pick and place operation. Leading with insulating layer 134, semiconductor die 124 from FIG. 3c are positioned over and mounted to carrier 344 with interface layer 346 using a pick and place operation. Because planarization layer 330 is formed over insulating layer 276, insulating layer 276 is vertically offset from insulating layer 134 by an amount equal to a thickness of planarization layer 330. Thus, insulating layer 276 and insulating layer 134 are non-planar. Additionally, IPD die 340 is vertically offset from insulating layer 134 of semiconductor die 124 by an amount equal to the thickness of planarization layer 330.

Figure 12B:
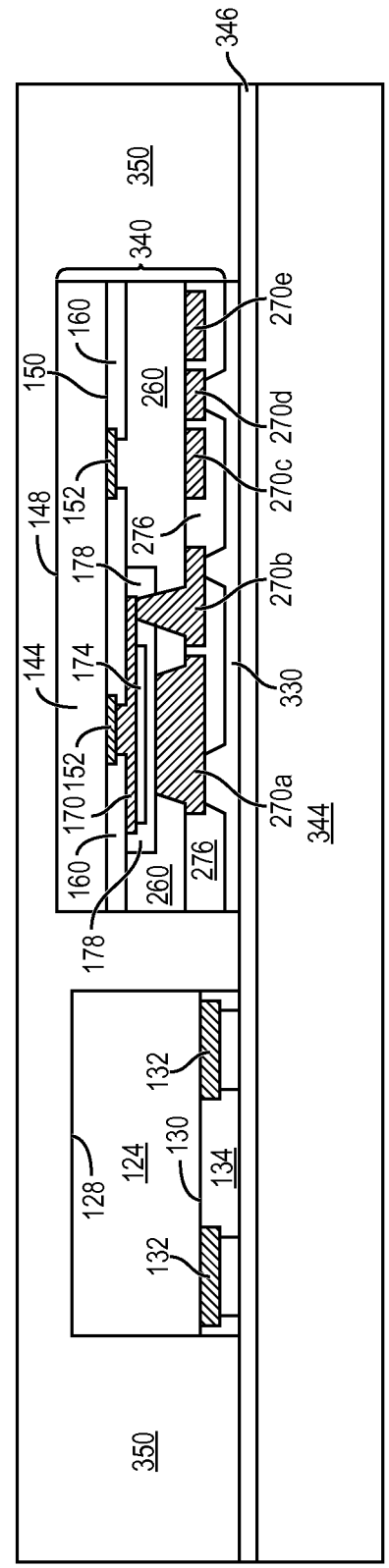

FIG. 12b shows the assembly from FIG. 12a, focusing on a single IPD die 340, and a single semiconductor die 124. An encapsulant or molding compound 350 is deposited over IPD die 340, semiconductor 124, and carrier 344 using a paste printing, compressive molding, transfer molding, liquid encapsulant molding, vacuum lamination, spin coating, or other suitable applicator. Encapsulant 350 can be polymer composite material, such as epoxy resin with filler, epoxy acrylate with filler, or polymer with proper filler. Encapsulant 350 is non-conductive and environmentally protects the semiconductor device from external elements and contaminants. Encapsulant 350 has high volume resistivity, (e.g., greater than E14 Ohm-cm), low dielectric constant (e.g., less than 4.0), and low loss tangent (e.g., less than 0.05).

Figure 12C:
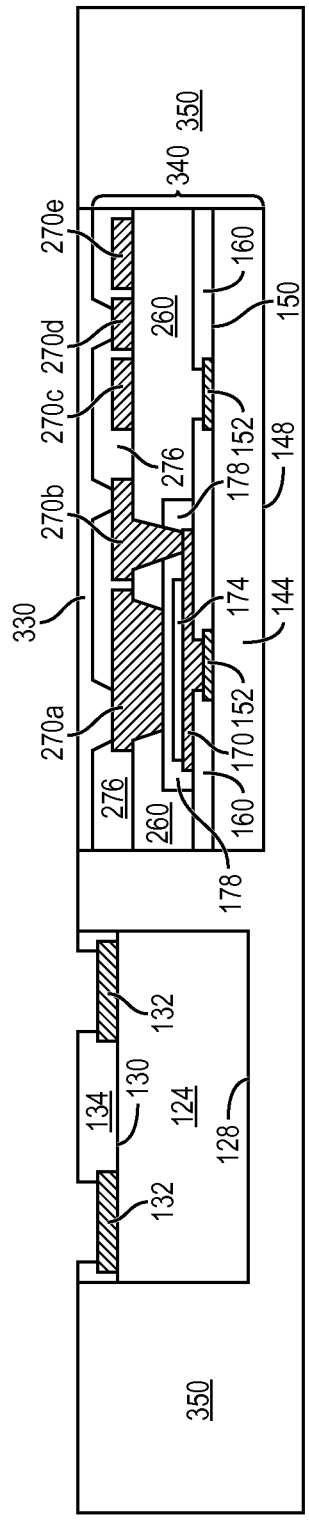

In FIG. 12c, carrier 344, and interface layer 346 are removed by chemical etching, mechanical peeling, CMP, mechanical grinding, thermal bake, UV light, laser scanning, or wet stripping to expose a surface of encapsulant 350, insulating layer 134, conductive layer 132, and planarization layer 330. Encapsulant 350 provides structural support for semiconductor die 124 and IPD die 340 after removal of carrier 344.

Figure 12D:
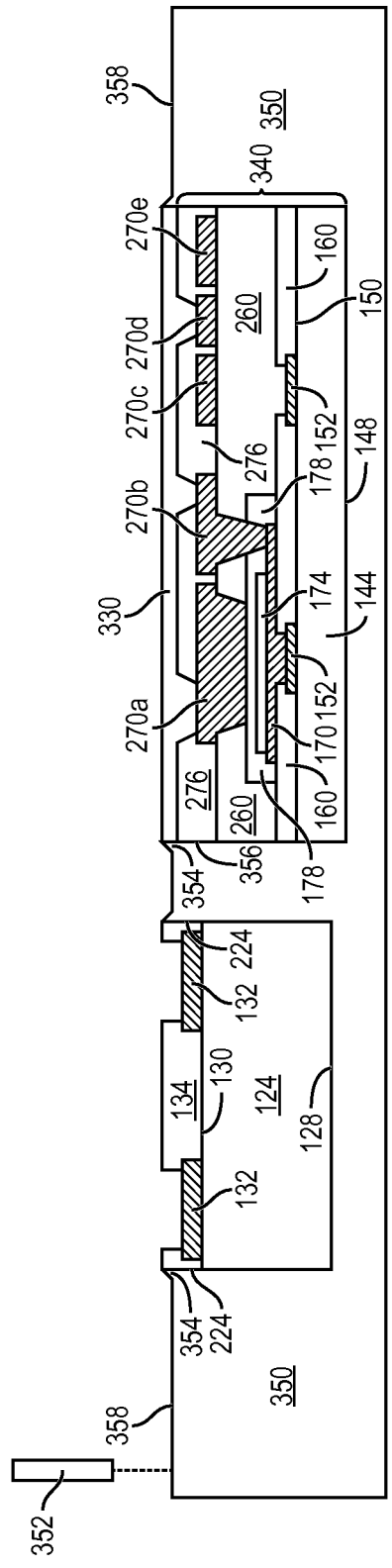

In FIG. 12d, encapsulant 350 is etched using a plasma process, wet chemical etching, or photoresist developing process to remove a portion of a surface of the encapsulant 280. Alternatively, a portion of encapsulant 350 is removed by LDA using laser 352. In one embodiment, a portion of the encapsulant 350, support structure 354, maintains coverage over a sidewall 224 of insulating layer 134. Support structure 354 also maintains coverage over a sidewall 356 of IPD die 340. Encapsulant 350 also has a surface 358 that is vertically offset from an exposed surface of insulating layer 134 and planarization layer 330.

Figure 12E:
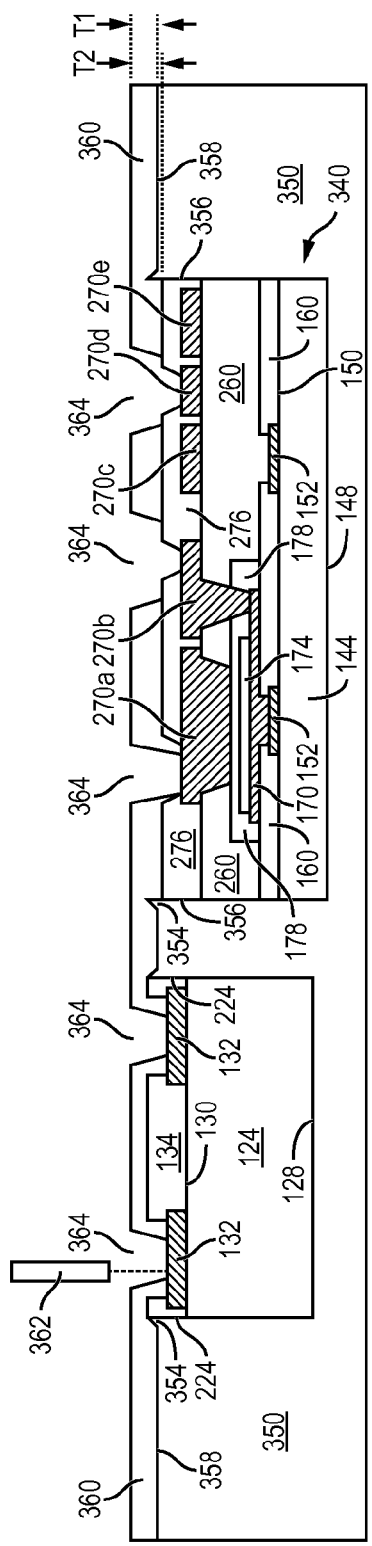

In. FIG. 12e, planarization layer 330 is removed by wet chemical stripping process, or an etching process with a patterned photoresist layer, to expose insulating layer 276 and conductive layer 270. An insulating or passivation layer 360 is formed over encapsulant 350, semiconductor die 124, and IPD die 340 using PVD, CVD, printing, spin coating, spray coating, screen printing or lamination. Insulating layer 360 contains one or more layers of SiO2, Si3N4, SiON, Ta2O5, Al2O3, organic polymer, or other material having similar insulating and structural properties.

The thickness of insulating layer 360 can be adjusted according to the design and function of IPD die 340. Insulating layer 360 has a first thickness T1 in a peripheral region or outside a footprint of IPD die 340. In one embodiment, thickness T1 of insulating layer 360 has a range between 5-25 µm. Insulating layer 360 has a second thickness T2 within a footprint of IPD die 340. Thickness T2 is greater than thickness T1 by an amount equal to the thickness of planarization layer 330. The thickness T2 of insulating layer 360 can be adjusted independently from, or in addition to, the thickness T1 of insulating layer 360, by increasing or decreasing the thickness of planarization layer 330 according to the design and function of the semiconductor device.

A portion of insulating layer 360 is removed by an etching process with a patterned photoresist layer to expose conductive layer 132 and conductive layer 270. Alternatively, a portion of insulating layer 360 is removed by LDA using laser 362 to expose conductive layer 132 and conductive layer 270. The resulting vias 364 can have a straight, sloped, angled, or stepped sidewall.

Figure 12F:
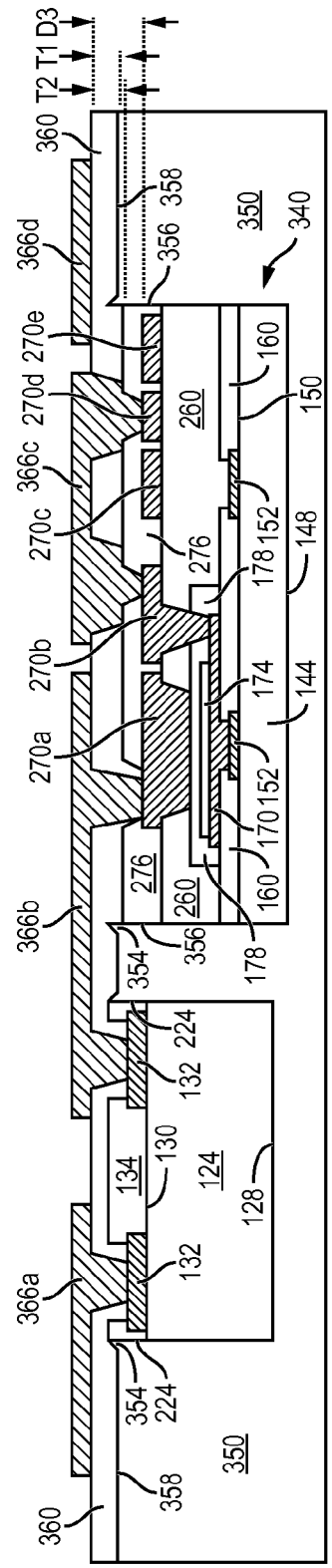

In FIG. 12f, an electrically conductive layer 366 is formed over insulating layer 360, insulating layer 276, insulating layer 134, conductive layer 132, and conductive layer 270 using patterning with PVD, CVD, sputtering, electrolytic plating, electroless plating process, or other suitable metal deposition process to form individual portions or sections 366a-366d. Conductive layer 366 can be one or more layers of Al, Cu, Sn, Ni, Au, Ag, or other suitable electrically conductive material. In one embodiment, a thickness of conductive layer 366 ranges between 3-12 µm. A portion of conductive layer 366 extends horizontally along insulating layer 360 and parallel to active surface 130 of semiconductor die 124 to laterally redistribute the electrical interconnect to conductive layers 132 and 270. Conductive layer 366 operates as a fan-out RDL, providing lateral redistribution for the electrical signals of semiconductor die 124 and IPD die 340. The individual portions of conductive layer 366a-366d can be electrically common or electrically isolated depending on the connectivity of the individual semiconductor die 124 and IPD die 340. A portion of conductive layer 366a extends through insulating layer 360 to electrically connect conductive layer 366a to conductive layer 132 of semiconductor die 124. A portion of conductive layer 366b extends through insulating layer 360 to electrically connect conductive layer 366b to conductive layer 132 of semiconductor die 124 and conductive layer 270a of IPD die 340.

A portion of conductive layer 366c extends through insulating layers 360 and 276 to electrically connect conductive layer 366c to conductive layers 270b and 270d. A portion of conductive layer 366c also extends horizontally along insulating layer 360, and operates as a stacked-inductor bridge or conductive bridge providing electrical interconnection between conductive layers 270b and 270d. Thus, conductive layer 366c is electrically connected to the inductor wing 270c-270e and semiconductor die 144. The distance or gap D3 between the horizontal portions of conductive layers 366a-366d and conductive layers 270a-270e can be controlled or adjusted by increasing or decreasing the thicknesses T1 and T2 of insulating layer 360 according to the design and function of IPD die 340. Semiconductor packages, particularly in high-current applications, are prone to leakage current between conductive layers or devices. Increasing the distance D3 by increasing the thicknesses T1 and T2 of insulating layer 360 provides the ability to reduce leakage current between conductive layers 366a-366d and the IPDs 342, semiconductor die 144, and semiconductor die 124.

Figure 12G:
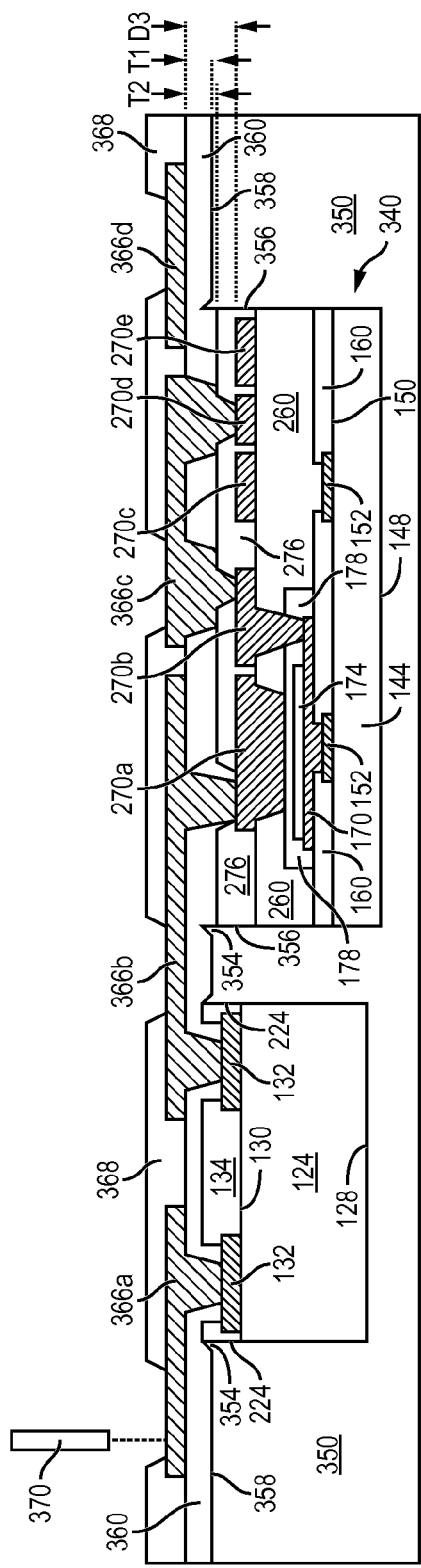

In FIG. 12g, an insulating or passivation layer 368 is formed over insulating layer 360 and conductive layer 366 using PVD, CVD, printing, spin coating, spray coating, screen printing or lamination. Insulating layer 368 contains one or more layers of SiO2, Si3N4, SiON, Ta2O5, Al2O3, organic polymer, or other material having similar insulating and structural properties. A portion of insulating layer 368 is removed by an etching process with a patterned photoresist layer to expose a portion of conductive layer 366. Alternatively, a portion of insulating layer 368 is removed by LDA using laser 370 to expose a portion of conductive layer 366.

Figure 12H:
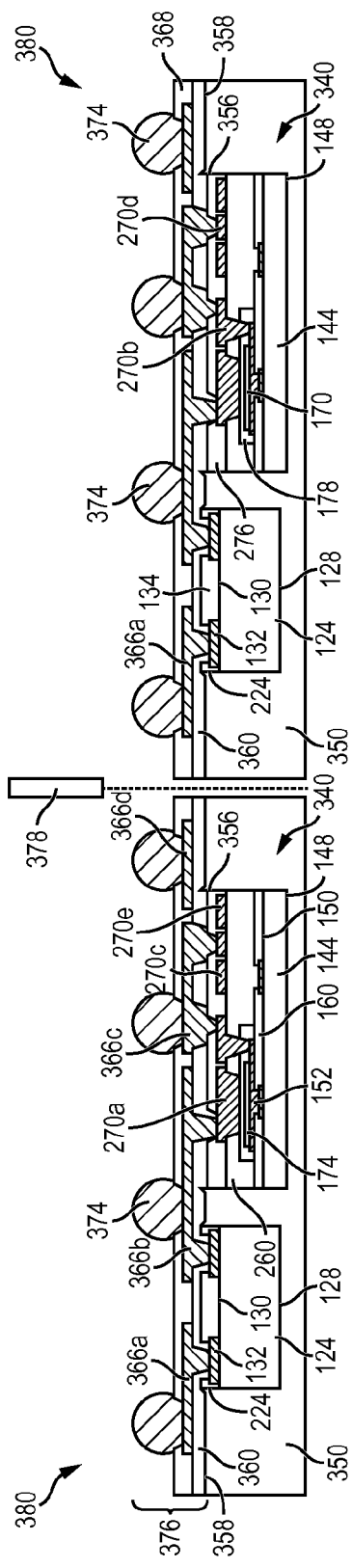

FIG. 12h shows the assembly from FIGS. 12a-12g with multiple IPD die 340 and semiconductor die 124. An electrically conductive bump material is deposited over the exposed portion of conductive layer 366 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 366 using a suitable attachment or bonding process. In one embodiment, the bump material is reflowed by heating the material above its melting point to form balls or bumps 374. In some applications, bumps 374 are reflowed a second time to improve electrical contact to conductive layer 366. A UBM layer can be formed under bumps 374. Bumps 374 can also be compression bonded to conductive layer 366. Bumps 374 represent one type of interconnect structure that can be formed over conductive layer 366. The interconnect structure can also use stud bump, micro bump, or other electrical interconnect.

Collectively, insulating layers 360, and 368, conductive layer 366, and bumps 374 constitute a build-up interconnect structure 376. Additional conductive and insulating layers may be formed over insulating layer 368 prior to forming bumps 374, to provide additional vertical and horizontal electrical connectivity across the package according to the design and functionality of the semiconductor device. The assembly from FIG. 12h is singulated through insulating layer 368, insulating layer 360, and encapsulant 350 with saw blade or laser cutting tool 378 to create individual semiconductor packages or Fo-WLCSP 380.

Figure 13:
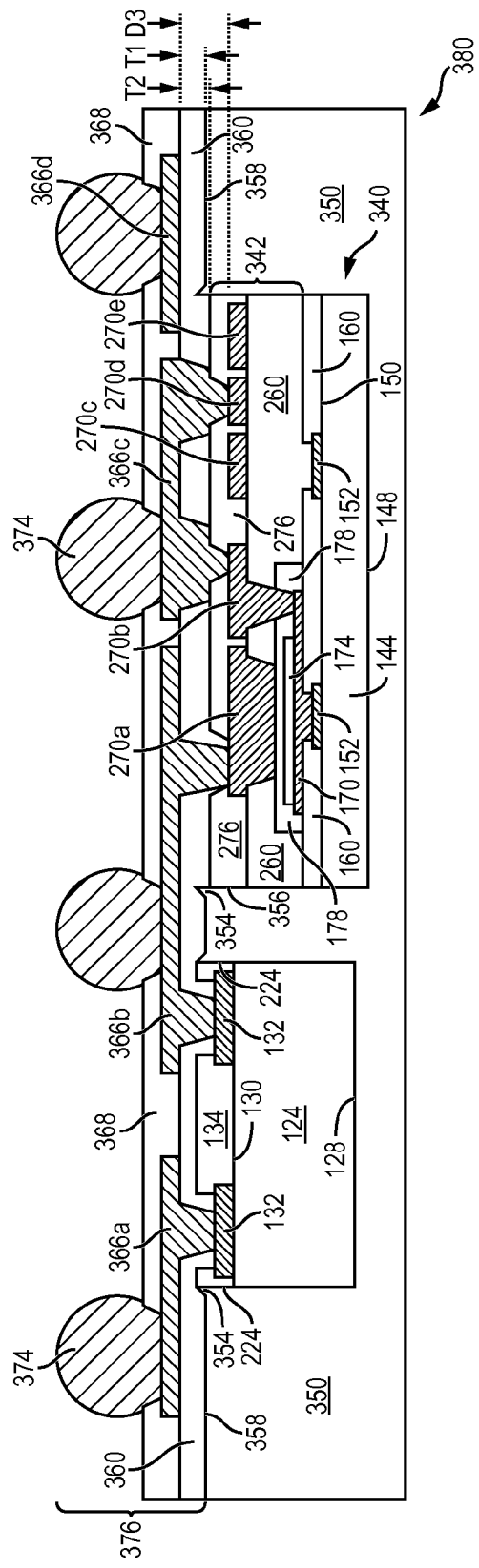
FIG. 13 illustrates a semiconductor package with a vertical offset between semiconductor die.

FIG. 13 shows Fo-WLCSP 380 after singulation. Fo-WLCSP 380 is similar to the assembly shown in FIG. 10, with a vertical offset between IPD die 340 and semiconductor die 124. Conductive layer 170, resistive layer 174, insulating layer 178, and conductive layer 270a form a MIM capacitor. Conductive layer 270b is electrically connected to conductive layer 170. Directly connecting conductive layer 270b to conductive layer 170 without an intervening conductive layer, for example, conductive layer 186b in FIG. 6, avoids the need for an ion milling or back sputtering process prior to depositing the intervening conductive layer, which allows for a higher degree of uniformity for insulating layer 178. Directly connecting conductive layer 270b to conductive layer 170 without an intervening conductive layer, for example, conductive layer 186b in FIG. 6, also reduces plasma damage on insulating layer 178, which acts as a capacitor dielectric material. The individual sections of conductive layer 270c-270e can be wound or coiled in plan-view to produce or exhibit the desired characteristics of an inductor.

Conductive layers 170, and 270, resistive layer 174, and insulating layers 160, 178, 260, and 276 constitute a plurality of passive circuit elements or IPDs 342 formed over semiconductor die 144. A temporary planarization layer 330 is formed over IPDs 342. Semiconductor die 144 are singulated to create individual IPD die 340. IPD die 340 and semiconductor die 124 are mounted over a temporary carrier 344. An encapsulant 350 is formed over semiconductor die 124, semiconductor die 144, and carrier 344. IPD die 340 is vertically offset from insulating layer 134 of semiconductor die 124 by an amount equal to the thickness of planarization layer 330. Encapsulant 350 provides structural support and stiffness during RDL and bump formation. An insulating layer 360 is formed over encapsulant 350, semiconductor die 124, and IPD die 340. The thickness of insulating layer 360 can be adjusted according to the design and functionality of IPD die 340.

An electrically conductive layer 366 is formed over insulating layer 360, IPD die 340 and semiconductor die 124. Conductive layer 366 operates as a fan-out RDL, providing lateral redistribution for the electrical signals of semiconductor die 124 and IPD die 340. The individual portions of conductive layer 366a-366d can be electrically common or electrically isolated depending on the connectivity of the individual semiconductor die 124 and IPD die 340. Conductive layer 366a is electrically connected to conductive layer 132 of semiconductor die 124. Conductive layer 366b is electrically connected to conductive layer 132 of semiconductor die 124 and conductive layer 270a of IPD die 340. Conductive layer 366c is electrically connected to conductive layers 270b and 270d. A portion of conductive layer 366c extends horizontally along insulating layer 360, and operates as a stacked-inductor bridge or conductive bridge providing electrical interconnection between conductive layers 270b and 270d. Thus, conductive layer 366c is electrically connected to the inductor wing 270c-270e and semiconductor die 144.

The distance or gap D3 between the horizontal portions of conductive layers 366a-366d and conductive layers 270a-270e can be controlled or adjusted by increasing or decreasing the thicknesses T1 and T2 of insulating layer 360 according to the design and function of IPD die 340. Semiconductor packages, particularly in high-current applications, are prone to leakage current between conductive layers or devices. Increasing the distance D3 by increasing the thicknesses T1 and T2 of insulating layer 360 provides the ability to reduce leakage current between conductive layers 366a-366d and the IPDs 342, semiconductor die 144, and semiconductor die 124.

In summary, a semiconductor device has a first semiconductor die (semiconductor die 144). A first inductor (bottom inductor wing 186c-186d) is formed over the first semiconductor die (semiconductor die 144). A second inductor (top inductor wing 196c-196e) is formed over the first inductor (bottom inductor wing 186c-186d) and aligned with the first inductor (bottom inductor wing 186c-186d). An insulating layer (insulating layer 230) is formed over the first semiconductor die (semiconductor die 144) and the first and second inductors (bottom inductor wing 186c-186d; top inductor wing 196c-196e). A conductive bridge (conductive layer 240c) is formed over the insulating layer (insulating layer 230) and electrically connected between the second inductor (top inductor wing 196c-196e) and the first semiconductor die (semiconductor die 144). The semiconductor device further includes a second semiconductor die (semiconductor die 124). A conductive layer (conductive layer 240b) is formed between the first and second semiconductor die (semiconductor die 144; semiconductor die 124). A capacitor (conductive layer 170, resistive layer 174, insulating layer 178, and conductive layer 186*b*) is formed over the first semiconductor die (semiconductor die 144). The insulating layer (insulating layer 290) can have a first thickness (thickness T1) outside a footprint of the first semiconductor die (semiconductor die 144) and a second thickness (thickness T2) greater than the first thickness (thickness T1) over a footprint of the first semiconductor die (semiconductor die 144). The thickness of the insulating layer (insulating layer 230) can range between 5 and 25 μm. An encapsulant (encapsulant 220) is formed over the first semiconductor die (semiconductor die 144).

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a first insulating layer over the semiconductor die;
   forming a first inductor on a surface of the first insulating layer;
   forming a first conductive layer over the surface of the first insulating layer;
   forming a second insulating layer over the first insulating layer, first inductor, and first conductive layer;
   depositing an encapsulant over the semiconductor die and around a side surface of the first insulating layer and a side surface of the second insulating layer; and
   forming an interconnect structure over the semiconductor die and first inductor, wherein the interconnect structure includes a conductive bridge formed over the second insulating layer and coupled between the first inductor and first conductive layer.

2. The method of claim 1, further including forming a second inductor aligned with the first inductor.

3. The method of claim 1, further including forming a third insulating layer over the second insulating layer and encapsulant with a first thickness over the encapsulant and a second thickness greater than the first thickness over the second insulating layer.

4. A method of making a semiconductor device, comprising:
   providing a semiconductor substrate;
   forming a first insulating layer over the semiconductor substrate;
   disposing a first conductive layer over the first insulating layer with a first portion of the first conductive layer being wound to form an inductor;
   forming a second insulating layer over the first insulating layer and first conductive layer;
   depositing an encapsulant over the semiconductor substrate and first insulating layer and around a side surface of the second insulating layer; and
   forming an interconnect structure over the semiconductor substrate and first conductive layer, wherein the interconnect structure includes a conductive bridge formed over the second insulating layer and coupled between the inductor and a second portion of the first conductive layer.

5. The method of claim 4, further including disposing a semiconductor die adjacent to the semiconductor substrate.

6. The method of claim 4, further including forming a third insulating layer over the second insulating layer and encapsulant.

7. The method of claim 6, wherein the third insulating layer includes a first thickness over the encapsulant and a second thickness greater than the first thickness over the second insulating layer.

8. A semiconductor device, comprising:
   a semiconductor substrate;
   a first insulating layer formed over the semiconductor substrate;
   a first conductive layer disposed over the first insulating layer, wherein a first portion of the first conductive layer is wound to form a first inductor;
   a second insulating layer formed over the first insulating layer and first conductive layer;
   an encapsulant deposited over the semiconductor substrate and around a side surface of the first insulating layer and a side surface of the second insulating layer; and
   an interconnect structure formed over the semiconductor substrate and first conductive layer, wherein the interconnect structure includes a conductive bridge formed over the second insulating layer and coupled between the first inductor and a second portion of the first conductive layer.

9. The semiconductor device of claim 8, further including a third insulating layer formed over the second insulating layer and encapsulant, wherein the third insulating layer includes a first thickness over the encapsulant and a second thickness greater than the first thickness over the second insulating layer.

10. The semiconductor device of claim 8, wherein a portion of the first conductive layer extends vertically through an opening in the first insulating layer.

11. The semiconductor device of claim 8, further including a semiconductor die disposed adjacent to the semiconductor substrate.

12. A semiconductor device, comprising:
    a first semiconductor die;
    a first insulating layer formed over the first semiconductor die;
    a first inductor formed on a surface of the first insulating layer;
    a first conductive layer formed over the surface of the first insulating layer;
    a second insulating layer formed over the first insulating layer, first inductor, and first conductive layer;
    an encapsulant deposited over the first semiconductor die and first insulating layer and around a side surface of the second insulating layer; and
    an interconnect structure formed over the first semiconductor die and first inductor, wherein the interconnect structure includes a conductive bridge formed over the second insulating layer and coupled between the first inductor and first conductive layer.

13. The semiconductor device of claim 12, further including a second semiconductor die disposed adjacent to the first semiconductor die.

14. The semiconductor device of claim 12, further including a third insulating layer formed over the second insulating layer and encapsulant, wherein the third insulating layer includes a first thickness over the encapsulant and a second thickness greater than the first thickness over the second insulating layer.

15. The semiconductor device of claim 12, further including a passive device disposed over the first semiconductor die.

16. The semiconductor device of claim 12, further including a second inductor aligned with the first inductor.

17. The semiconductor device of claim 8, further including a second inductor aligned with the first inductor.

18. The semiconductor device of claim 8, further including a passive device disposed over the semiconductor substrate.

19. A semiconductor device, comprising:
- a first semiconductor die;
- a first insulating layer formed over the first semiconductor die;
- a first inductor formed on a surface of the first insulating layer;
- a second insulating layer formed over the first insulating layer and first inductor;
- an encapsulant deposited around the first semiconductor die, first insulating layer, and second insulating layer; and
- an interconnect structure formed over the first semiconductor die and first inductor.

20. The semiconductor device of claim 19, further including a first conductive layer formed over the surface of the first insulating layer, wherein the interconnect structure includes a conductive bridge formed over the second insulating layer and coupled between the first inductor and first conductive layer.

21. The semiconductor device of claim 19, further including a second semiconductor die disposed adjacent to the first semiconductor die.

22. The semiconductor device of claim 19, further including a passive device disposed over the first semiconductor die.

23. The semiconductor device of claim 19, further including a third insulating layer formed over the second insulating layer and encapsulant, wherein the third insulating layer includes a first thickness over the encapsulant and a second thickness greater than the first thickness over the second insulating layer.

24. The semiconductor device of claim 19, further including a second inductor aligned with the first inductor.

* * * * *